(12) United States Patent
Akram

(10) Patent No.: US 10,181,486 B2
(45) Date of Patent: Jan. 15, 2019

(54) ELEVATED POCKET PIXELS, IMAGING DEVICES AND SYSTEMS INCLUDING THE SAME AND METHOD OF FORMING THE SAME

(71) Applicant: Micron Technology, Inc., Boise, ID (US)

(72) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/896,686

(22) Filed: Feb. 14, 2018

(65) Prior Publication Data

US 2018/0175085 A1    Jun. 21, 2018

Related U.S. Application Data

(60) Continuation of application No. 15/254,745, filed on Sep. 1, 2016, now Pat. No. 9,911,769, which is a
(Continued)

(51) Int. Cl.
*H01L 27/146* (2006.01)
*H01L 31/0352* (2006.01)
(Continued)

(52) U.S. Cl.
CPC ...... *H01L 27/14607* (2013.01); *H01L 27/146* (2013.01); *H01L 27/14601* (2013.01); *H01L 27/14603* (2013.01); *H01L 27/14605* (2013.01); *H01L 27/14621* (2013.01); *H01L 27/14627* (2013.01); *H01L 27/14632* (2013.01); *H01L 27/14643* (2013.01); *H01L 27/14645* (2013.01); *H01L 27/14647* (2013.01); *H01L 27/14685* (2013.01); *H01L 27/14687* (2013.01); *H01L 27/14689* (2013.01); *H01L 27/14692* (2013.01);
(Continued)

(58) Field of Classification Search
CPC ......... H01L 27/14643; H01L 27/14603; H01L 27/14601; H01L 27/146; H01L 27/14647; H01L 31/0352; H01L 27/14607
See application file for complete search history.

(56) References Cited

U.S. PATENT DOCUMENTS 4,786,186 A    11/1988    Okumura et al.
5,051,803 A    9/1991    Kitamura et al.
(Continued)

OTHER PUBLICATIONS

Bendis et al. "CMOS Active Pixel Image Sensor," IEEE Transactions on Electron Devices, vol. 41, No. 3, pp. 452-453, Mar. 1994.
(Continued)

*Primary Examiner* — Fei Fei Yeung Lopez
(74) *Attorney, Agent, or Firm* — Perkins Coie LLP

(57) ABSTRACT

An elevated photosensor for image sensors and methods of forming the photosensor. The photosensor may have light sensors having indentation features including, but not limited to, v-shaped, u-shaped, or other shaped features. Light sensors having such an indentation feature can redirect incident light that is not absorbed by one portion of the photosensor to another portion of the photosensor for additional absorption. In addition, the elevated photosensors reduce the size of the pixel cells while reducing leakage, image lag, and barrier problems.

19 Claims, 25 Drawing Sheets

Related U.S. Application Data continuation of application No. 14/448,756, filed on Jul. 31, 2014, now Pat. No. 9,437,762, which is a continuation of application No. 13/084,649, filed on Apr. 12, 2011, now Pat. No. 8,816,405, which is a division of application No. 11/657,013, filed on Jan. 24, 2007, now Pat. No. 7,952,128.

(51) Int. Cl.
| | |
|---|---|
| H01L 31/0216 | (2014.01) |
| H01L 31/028 | (2006.01) |
| H01L 31/0376 | (2006.01) |
| H01L 31/18 | (2006.01) |
| H01L 31/0224 | (2006.01) |
| H01L 31/0288 | (2006.01) |

(52) U.S. Cl.
CPC ........ *H01L 31/028* (2013.01); *H01L 31/0288* (2013.01); *H01L 31/02162* (2013.01); *H01L 31/022408* (2013.01); *H01L 31/0352* (2013.01); *H01L 31/03762* (2013.01); *H01L 31/035281* (2013.01); *H01L 31/1804* (2013.01)

(56) References Cited

U.S. PATENT DOCUMENTS

| | | | |
|---|---|---|---|
| 6,177,333 B1 | 1/2001 | Rhodes et al. | |
| 6,204,524 B1 | 3/2001 | Rhodes et al. | |
| 6,329,679 B1 | 12/2001 | Park et al. | |
| 6,529,679 B1 | 3/2003 | Suito et al. | |
| 7,952,158 B2 | 5/2011 | Akram | |
| 8,816,405 B2 | 8/2014 | Akram | |
| 9,437,762 B2 | 9/2016 | Akram et al. | |
| 2001/0042864 A1 | 11/2001 | Kato et al. | |
| 2001/0052941 A1 | 12/2001 | Matsunaga et al. | |
| 2002/0197763 A1 | 12/2002 | Yeh et al. | |
| 2003/0011315 A1 | 1/2003 | Ito et al. | |
| 2003/0127647 A1 | 7/2003 | Street et al. | |
| 2003/0213915 A1 | 11/2003 | Chao et al. | |
| 2005/0040440 A1 | 2/2005 | Murakami et al. | |
| 2005/0093038 A1 | 5/2005 | Rhodes et al. | |
| 2005/0180159 A1 | 8/2005 | Wu et al. | |
| 2005/0236553 A1 | 10/2005 | Noto et al. | |
| 2005/0269606 A1* | 12/2005 | Mouli | H01L 27/14603 257/292 |
| 2006/0011955 A1 | 1/2006 | Baggenstoss et al. | |
| 2006/0076588 A1 | 4/2006 | Nozaki et al. | |
| 2007/0138590 A1* | 6/2007 | Wells | H01L 27/14601 257/462 |
| 2007/0145505 A1 | 6/2007 | Kim et al. | |
| 2008/0128846 A1 | 6/2008 | Bui et al. | |
| 2008/0290440 A1* | 11/2008 | Lee | H01L 27/1462 257/436 |
| 2016/0372505 A1 | 12/2016 | Akram et al. | |

OTHER PUBLICATIONS

Nixon et al. "256×256 CMOS Active Pixel Sensor Camera-on-a-Chip," IEEE Journal of Solid-State Circuits, vol. 31, No. 12, pp. 2046-2050, Dec. 1996.

\* cited by examiner

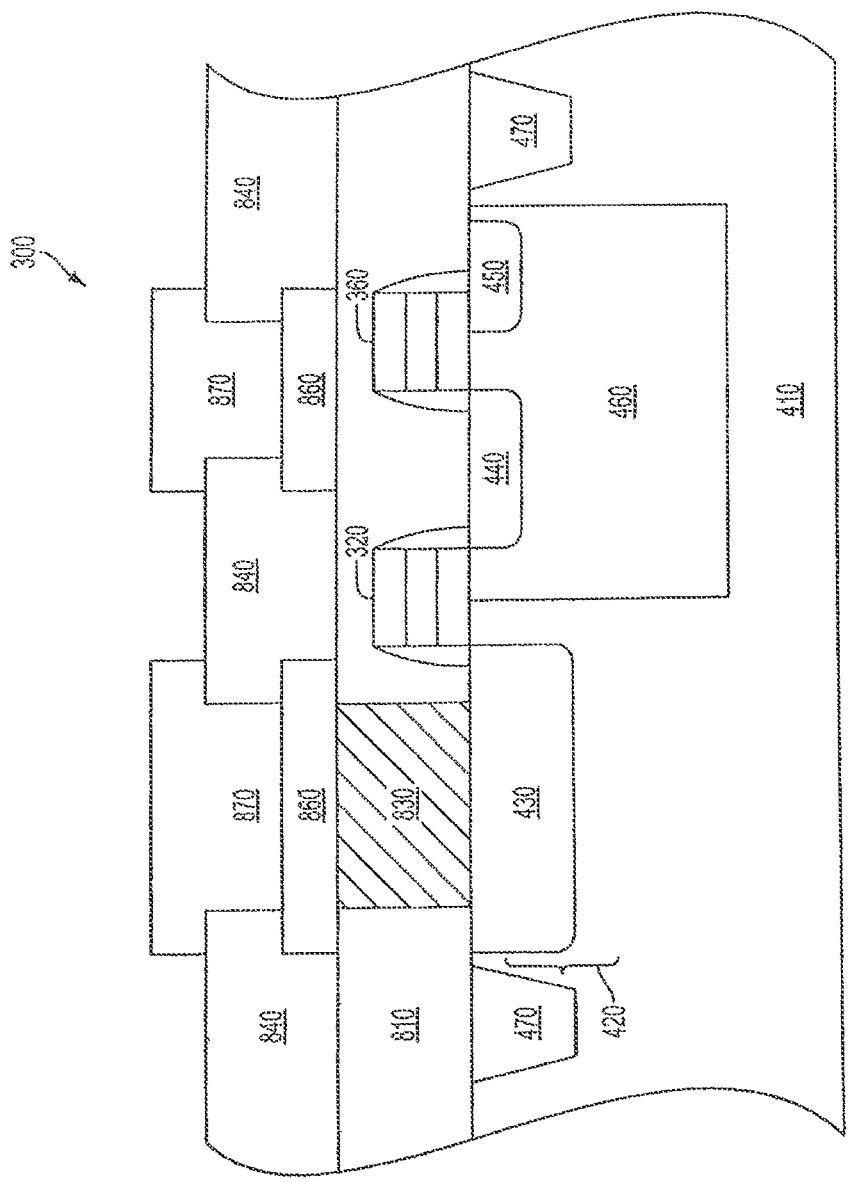

ELEVATED POCKET PIXELS, IMAGING DEVICES AND SYSTEMS INCLUDING THE SAME AND METHOD OF FORMING THE SAME

CROSS-REFERENCE TO RELATED APPLICATION(S)

This application is a continuation of U.S. application Ser. No. 15/254,745, filed Sep. 1, 2016, which is a continuation of U.S. application Ser. No. 14/448,756, filed Jul. 31, 2014, now U.S. Pat. No. 9,437,762, which is a continuation of U.S. application Ser. No. 13/084,649, filed Apr. 12, 2011, now U.S. Pat. No. 8,816,405, which a divisional of U.S. application Ser. No. 11/657,013, filed Jan. 24, 2007, now U.S. Pat. No. 7,952,158, each of which is hereby incorporated by reference herein in its entirety. This application is also related to application Ser. No. 11/300,378, filed Dec. 15, 2005, now U.S. Pat. No. 7,456,452, which is hereby incorporated by reference herein in its entirety.

BACKGROUND

Solid state image sensors are increasingly being used in a wide variety of imaging applications as low cost imaging devices. One such image sensor is a CMOS image sensor. A CMOS image sensor includes a focal plane array of pixel cells. Each cell includes a photosensor, photogate, photoconductor, or photodiode having an associated charge accumulation region within a substrate for accumulating photo-generated charge. Each pixel cell may include a transistor for transferring charge from the charge accumulation region to a floating diffusion region, and a transistor for resetting the floating diffusion region to a predetermined charge level. The pixel cell may also include a source follower transistor for receiving and amplifying charge from the floating diffusion region and an access transistor for controlling the readout of the cell's contents from the source follower transistor.

Accordingly, in a CMOS image sensor, the active elements of a pixel cell perform the necessary functions of: (1) photon to charge conversion; (2) accumulation of image charge; (3) transfer of charge to the floating diffusion region accompanied by charge amplification; (4) resetting the floating diffusion region to a known state; (5) selection of a pixel cell for readout; and (6) output and amplification of a signal representing pixel cell stored charge from the floating diffusion region.

CMOS image sensors of the type discussed above are as discussed in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, assigned to Micron Technology, Inc., which describe the operation of CMOS image sensors, and the contents each of which are incorporated herein by reference.

In a CMOS image sensor having photodiodes as the photosensors, when incident light strikes the surface of a photosensor, electron/hole pairs are generated in a p-n junction of the photosensor. The generated electrons are collected in the n-type region of the photosensor. The photo charge moves from the initial charge accumulation region to the floating diffusion region or the charge may be transferred to the floating diffusion region via a transfer transistor. The charge at the floating diffusion region is typically converted to a pixel output voltage by a source follower transistor.

CMOS image sensors may have difficulty transferring all of the photogenerated charge from the photosensor to the floating diffusion region. One problem with transferring charge occurs when the n-type silicon layer of the photosensor is located close to the surface; this causes electron/carrier recombination due to surface defects. There is a need to reduce this electron/carrier recombination to achieve good charge transfer to the floating diffusion region. Another obstacle hindering "complete" charge transference includes potential barriers that exist at the gate of the transfer transistor.

Additionally, known CMOS image sensors provide only approximately a fifty percent fill factor, meaning only half of the pixel cell is utilized in converting light to charge carriers. As shown in FIG. 1, only a small portion of the pixel cell 100 is occupied by the photosensor 110 (e.g., a photodiode). The remainder of the cell 100 includes the floating diffusion region 120, coupled to a transfer transistor gate 170, and source/drain regions 140 for reset, source follower, and row select transistors having respective gates 130, 150, and 160. It is desirable to increase the fill factor of the cell 100.

Image sensors may utilize a pixel cell containing a p-n-p photodiode photosensor 110 as is shown in FIG. 2, which is a cross-sectional view of the pixel cell 100 of FIG. 1, taken along line A-A'. The pixel cell 100 shown in FIG. 2 has a p-type substrate 235 with a p-well 225 formed therein. In the illustrated example, a p-type region 205 of photosensor 110 is located closest to the surface of substrate 235 and an n-type region 215 is buried beneath the p-type region 205. The p-n-p photodiode photosensor 110 has some drawbacks. First, there can be a lag problem since the pixel cell 100 uses a transfer transistor gate 170 for transferring charge to the floating diffusion region 120. Lag occurs because during integration the electron carriers are collected in the sandwiched n-type region 215 and then transferred to the floating diffusion region 120 through the transfer transistor gate 170. In order to fully utilize the generated electron carrier, it is necessary to eliminate two energy barriers to reach the floating diffusion region 120 (i.e., there is one barrier between the photosensor 110 and the transfer transistor gate 170 and another barrier between the transfer transistor gate 110 and floating diffusion region 120).

Charge leakage is another problem associated with the conventional p-n-p photodiode photosensor 110. One source of such leakage occurs when the transfer transistor gate 170 length is too short, causing sub-threshold current to become significantly high due to charge breakdown between n-type regions on both sides of the transfer transistor gate channel.

Additionally, as the total area of pixel cells continues to decrease (due to desired scaling), it becomes increasingly important to create high sensitivity photosensors 110 that utilize a minimum amount of surface area. Raised photosensors 110', as shown in FIG. 2A, have been proposed as a way to increase the fill factor and optimize the sensitivity of a CMOS pixel cell 100' by increasing the sensing area of the cell 100' without increasing the surface area of the substrate 235. Further, the raised photosensor 110' increases the quantum efficiency of the cell 100' by bringing the sensing region closer to the microlens (not shown) used to focus light on the photosensor 110'. However, raised photosensors 110' also have problems with leakage current across their elevated p-n junctions. Accordingly, a raised photosensor 110' that reduces this leakage, while increasing the quantum efficiency of the pixel cell 100', is desired.

Moreover, referring to FIGS. 2 and 2A, in CMOS image sensors, electrons are generated by light incident on the photosensor 110, 110' and are stored in the n-type region 215, 215'. These charges are transferred to the floating diffusion region 120 by the transfer transistor gate 170 when the transfer transistor gate 170 is activated. The source follower transistor (FIG. 1) produces an output signal based on the transferred charges. A maximum output signal is proportional to the number of electrons extracted from the photosensor 110, 110'. However, a certain amount of incident light is not absorbed by the photosensor 110, 110', but, is instead reflected from its surface and lost. The loss of this incident light decreases responsivity, dynamic range and quantum efficiency of the image sensor.

Accordingly, it is desirable to have a raised photosensor that better captures reflected incident light and directs the reflected light to the photosensor so that more of the light is absorbed and detected.

BRIEF DESCRIPTION OF THE DRAWINGS

FIG. 5G illustrates the embodiment of FIG. 5A at a stage of processing subsequent to that shown in FIG. 5F.

FIG. 5I illustrates the embodiment of FIG. 5A at a stage of processing subsequent to that shown in FIG. 5H.

DETAILED DESCRIPTION

Figure 1:
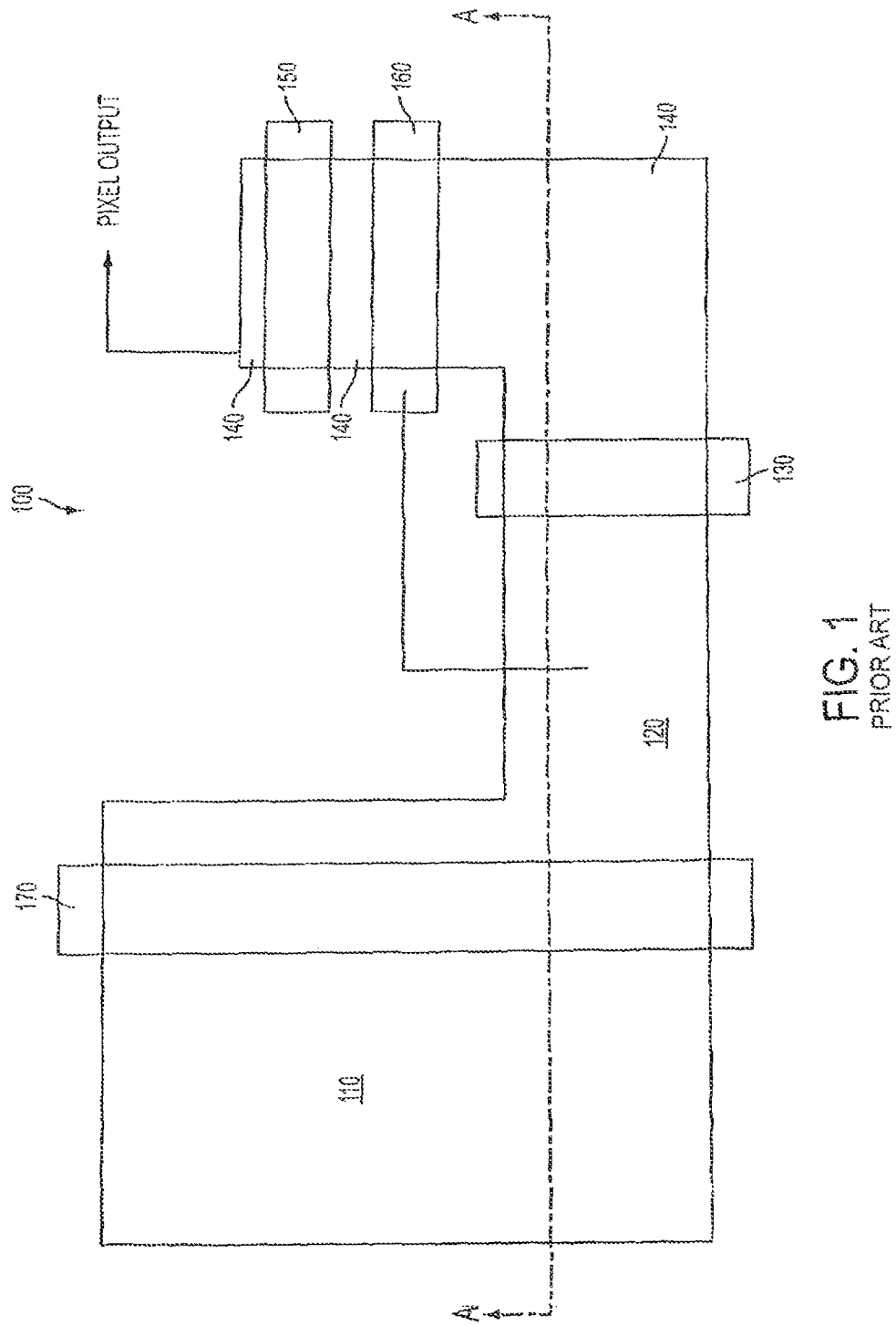
FIG. 1 is a diagram of a prior art image sensor/pixel cell.
Figure 2:
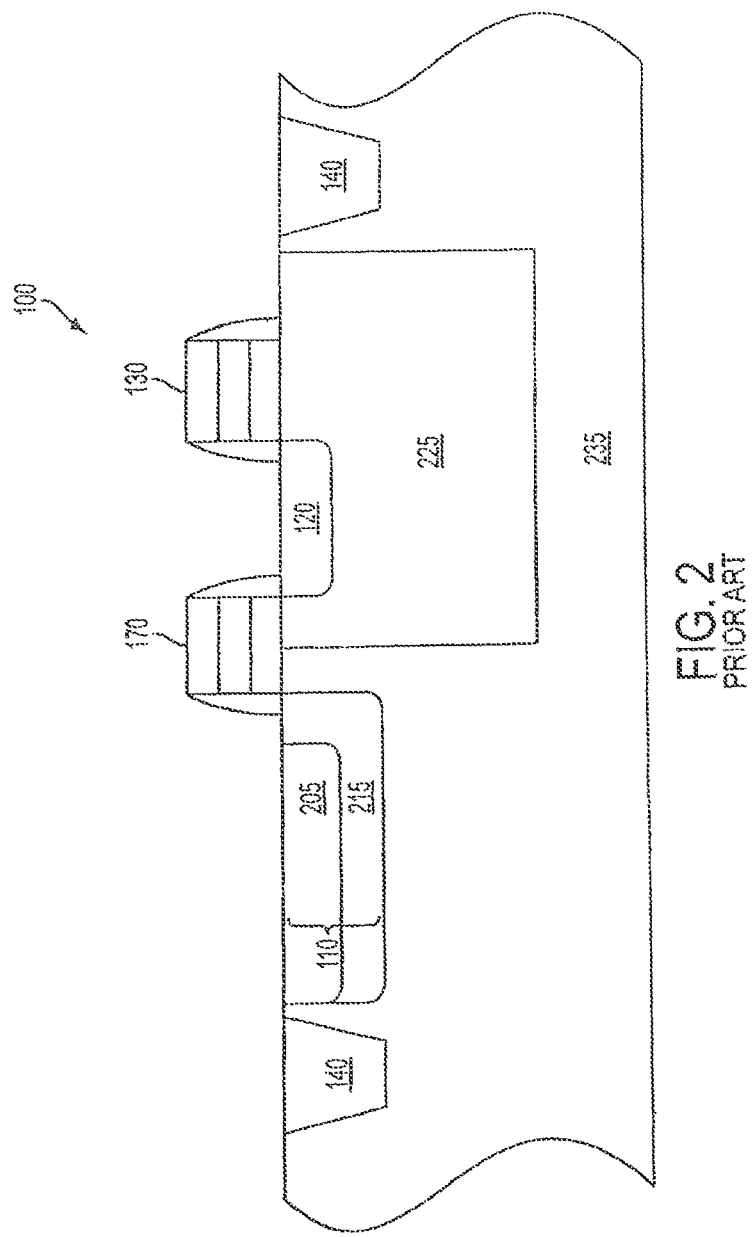
FIG. 2 is a cross-sectional view of a prior art pixel cell and photosensor.
Figure 2A:
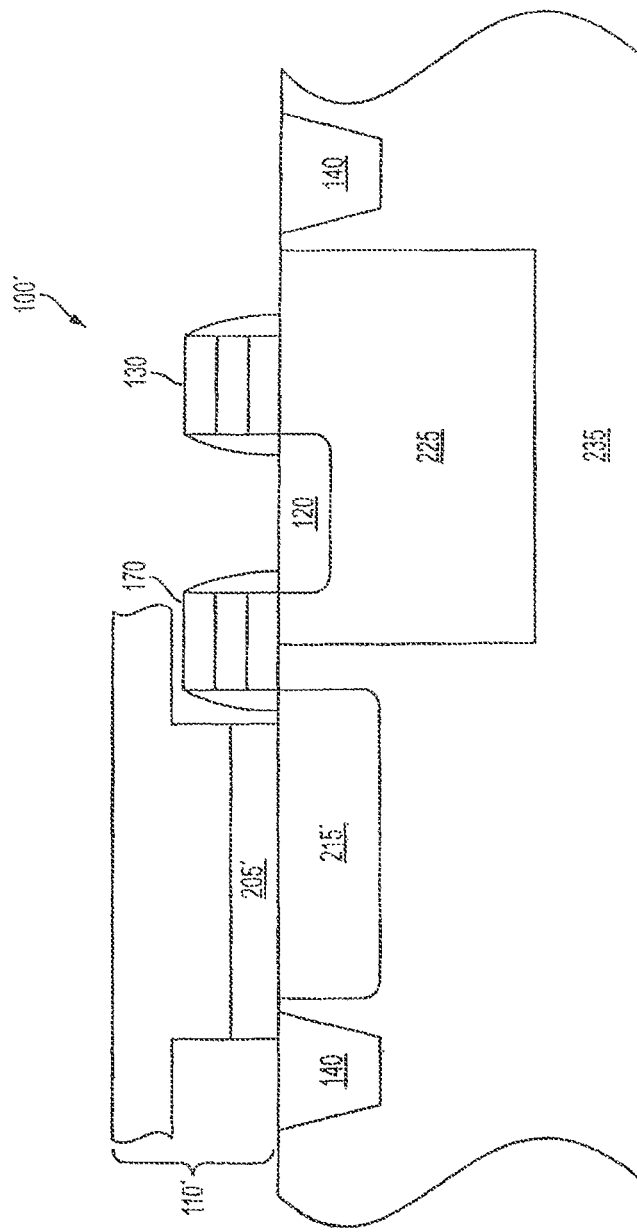
FIG. 2A is a cross-sectional view of a prior art pixel cell and raised photosensor.

In the following detailed description, reference is made to the accompanying drawings which form a part hereof and illustrate embodiments that may be practiced. It should be understood that like reference numerals represent like elements throughout the drawings. These embodiments are described in sufficient detail to enable those skilled in the art to practice them, and it is to be understood that other embodiments may be utilized, and that structural, logical and electrical changes may be made.

The term "substrate" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, gallium arsenide, or other semiconductor material, for example.

The term "pixel" or "pixel cell" refers to a picture element unit cell containing a photosensor and transistors for converting light radiation to an electrical signal. For purposes of illustration, a representative pixel cell is illustrated in the figures and the description herein and, typically, fabrication of all pixel cells in an imager pixel array will proceed simultaneously in a similar fashion. Moreover, while a four-transistor pixel cell is described, the embodiments are not limited to a four transistor configuration. The embodiments may be employed with any suitable electrical pixel cell architecture, such as two-transistor, three-transistor, five- or more transistor pixel cells.

Figure 3:
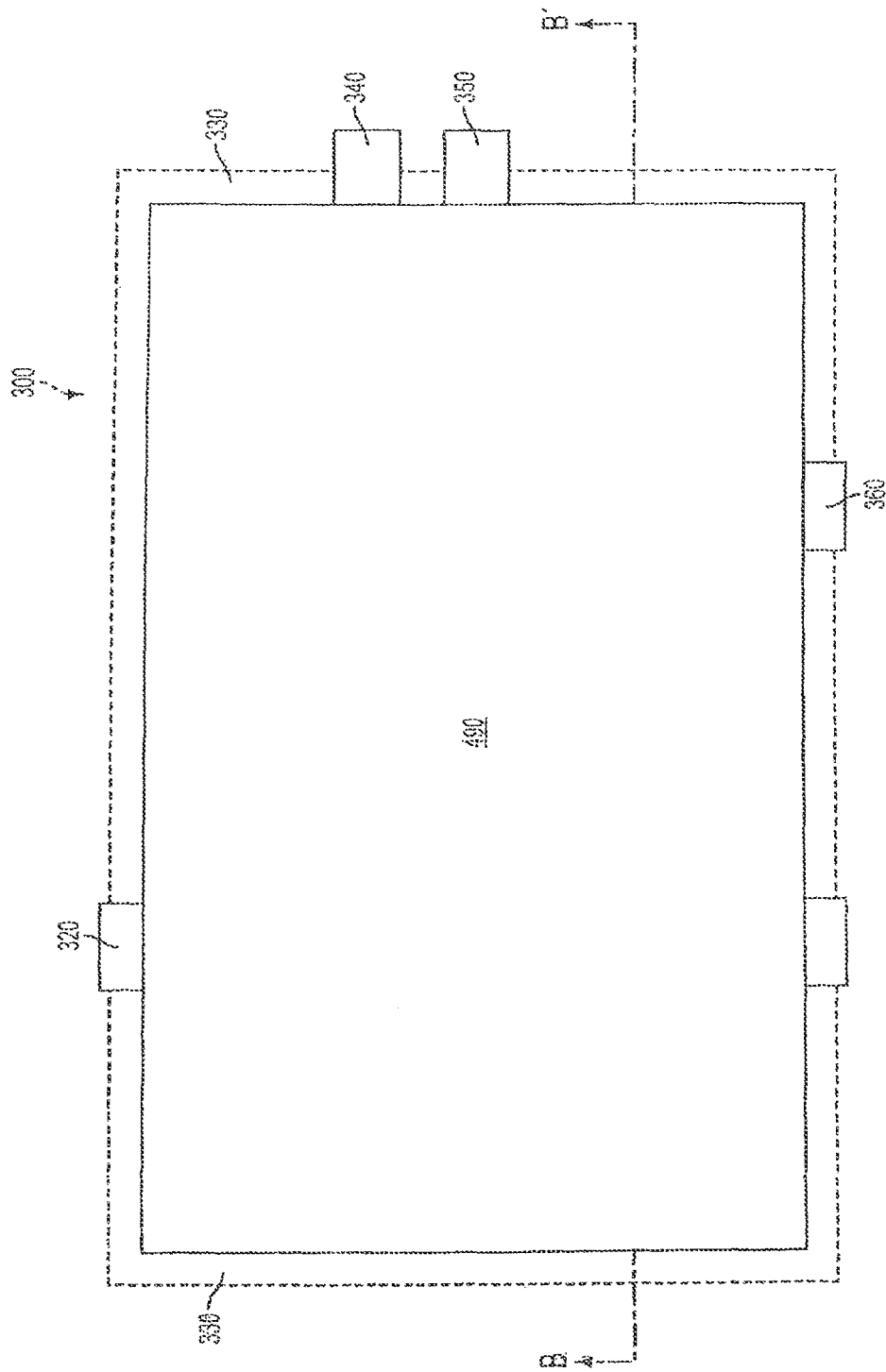
FIG. 3 is a block diagram of an embodiment discussed herein.

In the following description, the embodiments are described in relation to a CMOS image sensor for convenience purposes only; further embodiments, however, have wider applicability to any photosensor of any image sensor such as charge-couple devices (CCD). Now referring to the figures, FIG. 3 illustrates a pixel cell 300 constructed in accordance with a first embodiment. From the top plan view of the pixel cell 300, a raised photosensitive region 490 (described in more detail below) and cell insulation region 330 can be seen. The fill factor of the cell 300 is nearly 100 percent, as the photosensitive region 490 covers the entire surface area of the cell 300. Although FIG. 3 shows the raised photosensitive region 490 as covering the entire pixel cell 300, the raised photosensitive region 490 could have a smaller surface area and could cover much less of pixel cell 300, if desired. Also shown in FIG. 3 is cell insulation region 330 surrounding the raised photosensitive region 490 so as to insulate the pixel cell 300 from other cells and/or circuitry when the cell 300 if part of an array or image sensor. Alternatively, isolation trenches or regions (not shown) may be formed in the raised photosensitive region 490 to provide isolation of the raised photosensitive region 490 from raised portions of adjacent cells. Also shown in FIG. 3 are transfer transistor gate 320, source follower transistor gate 340, row select transistor gate 350 and reset transistor gate 360. It should be noted that upper electrode layer 471 (described below) is not illustrated in FIG. 3 to allow the 0m view illustration of pixel cell 300 to show photosensitive region 490.

Figure 4:
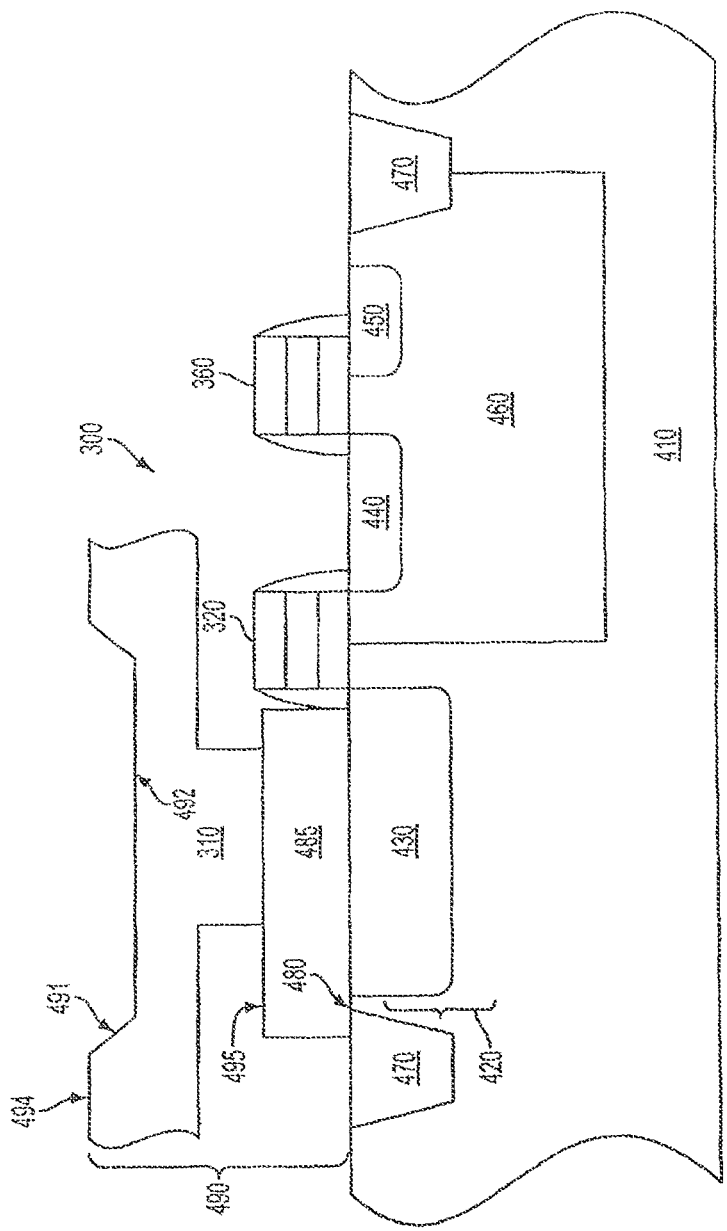
FIG. 4 is a cross-sectional view of an embodiment of a portion of the FIG. 3 photosensor.

FIG. 4 illustrate cross-sectional views of different embodiments of the pixel cell 300, taken along line B-B' of FIG. 3. Referring to FIG. 4, a photosensor 420 having a doped region 430 is formed in a substrate 410. The photosensor 420 is a photodiode and may be a pinned p-n-p, n-p-n, p-n or n-p junction photodiode, a Schottky photodiode, or any other suitable photodiode. For illustrative purposes only, the photosensor 420 is an n-p photodiode, and substrate 410 is a p-type substrate.

FIG. 4 also illustrates a floating diffusion region 440 and shallow trench isolation (STI) regions 470 in the substrate 410. A drain region 450 is also formed in the substrate 410. Other structures of pixel cell 300 include a transfer transistor gate 320, and reset transistor gate 360 having a similar gatestack as that of the transfer transistor gate 320.

As shown in FIG. 4, substrate 410 has a first surface level 480. An epitaxial layer 485 is grown from the top of this first surface level 480 to a second surface level 495. Above the epitaxial layer 485 is a hydrogenated amorphous silicon layer 310 for the photosensitive region 490. As used herein, the term "hydrogenated amorphous silicon" means either conventional hydrogenated amorphous silicon (represented a-Si:H) or deuterated amorphous silicon (represented a-Si:D), having deuterium substituted for hydrogen.

The epitaxial layer 485 and the hydrogenated amorphous silicon photosensitive region 490 are doped such that they have opposite doping types to create a p-n junction above the surface level 480 of the substrate 410. This creates, in effect, an elevated or raised photosensitive region 490. In FIG. 4, the epitaxial layer 485 is doped p-type, creating a p-n junction with the n-type surface region 430. Accordingly, the hydrogenated amorphous silicon photosensitive region 490 is doped n-type. There are several advantages of having an elevated photosensitive region 490 constructed in accordance with the illustrated embodiment such as increasing the fill factor and optimizing the sensitivity of the pixel cell 300 by increasing the sensing area of the cell 300.

Photosensitive region 490 does not have a planar upper surface allowing for an even higher fill factor and further increasing the quantum efficiency of the raised photosensitive region 490. In known photosensors, which have a planar upper surface, some of the incident light is absorbed by the photosensors, however, some of the incident light is reflected off the surface of the photosensors. The raised photosensitive region 490 of the illustrated embodiment has, instead, an upper surface profile which provides slanted or curved sidewalls 491 capable of directing light reflected off one portion of the raised photosensitive region 490 to another portion for the photosensitive region 490 for capture. In the FIG. 4 embodiment, the upper surface 494 has an indentation, pocket or trench having side walls 491, shown in greater detail in FIG. 4A, which is an expanded cross-sectional view of the raised photosensitive region 490 of FIG. 3. It should be appreciated that while FIG. 4 shows a flat-bottomed trench 492, it may also have a rounded bottom or v-shaped bottom.

Figure 4A:
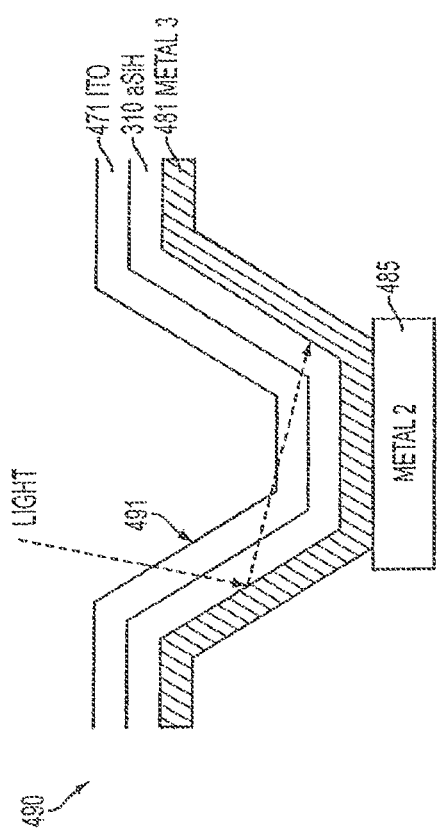
FIG. 4A is a cross-sectional view of another embodiment discussed herein.

As shown in FIG. 4A, raised photosensitive region 490 has a u-shaped cross-sectional profile; however, other cross-sectional profiles, e.g., a v-shaped profile (FIG. 4C described below) or similar u-shaped configuration (FIG. 4D described below), may also be used. In the illustrated embodiment, raised photosensitive region 490 comprises an upper electrode layer 471 (e.g., transparent such as ITO) above a hydrogenated amorphous silicon layer 490 above a metal conductive layer 481. Each layer is configured to contour to the indentation shape of photosensitive region 490.

Figure 4B:
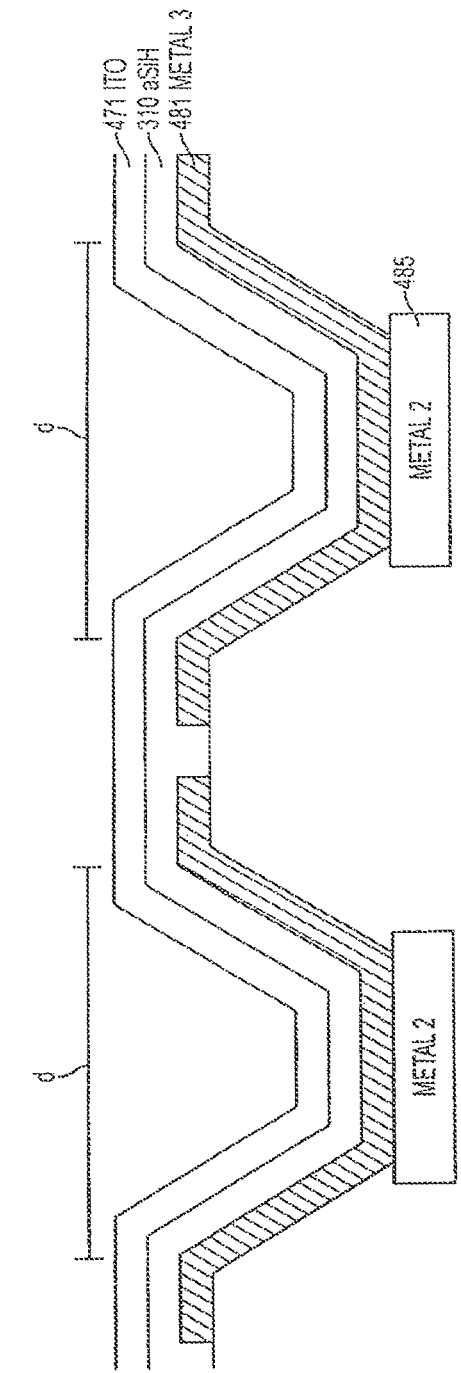
FIG. 4B is a cross-sectional view of another embodiment discussed herein.

With the u-shaped configuration illustrated in FIG. 4A, any light that is reflected off the surface of the raised photosensitive region 490 is redirected to another location on the raised photosensitive region 490 to have another chance at being absorbed. If light is not absorbed at that location, it may be reflected again and redirected to another location on the raised photosensitive region 490 to have yet another chance at being absorbed. Multiple redirection of reflected light may occur in any embodiment described herein. It should also be appreciated that a pixel cell 300 can have a series of photosensitive regions and thus, having a series of u-shaped photosensitive regions, as illustrated in FIG. 4B, having an effective area "d" determined by the desired light wavelength of the light to pass through, for example, red, green or blue light.

Figure 4C:
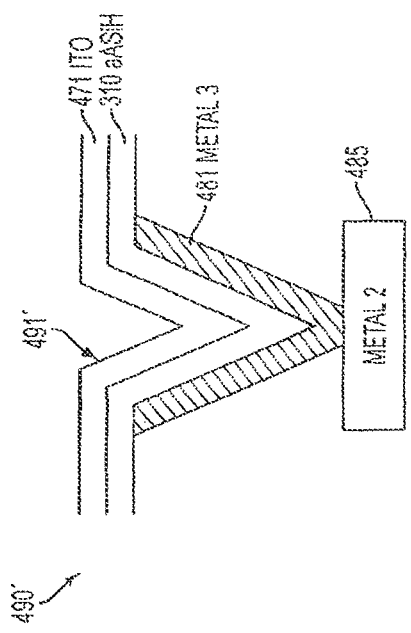
FIG. 4C is a cross-sectional view of another embodiment discussed herein.

FIG. 4C is an expanded cross-section view of another embodiment, wherein the raised photosensitive region 490' has a v-shaped trench configuration. Again, sidewalls 491' are provided in the upper surface profile of photosensitive region 490' capable of redirecting reflected light from one portion of the photosensitive region to another.

Figure 4D:
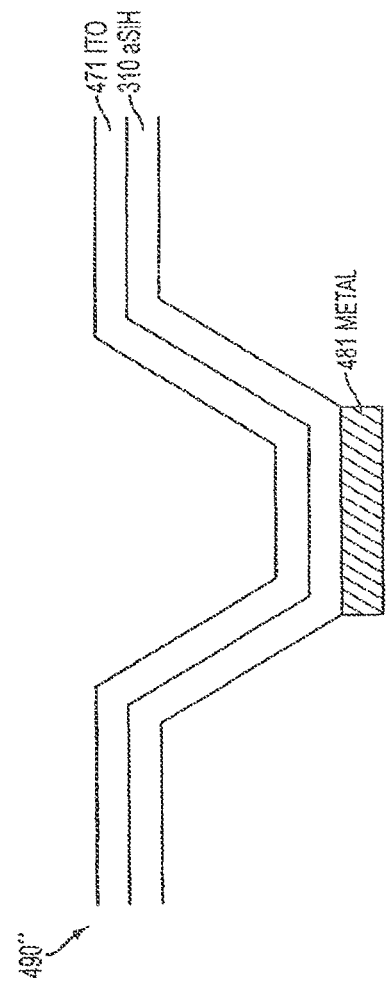
FIG. 4D is a cross-sectional view of another embodiment discussed herein.

FIG. 4D is an expanded cross-sectional view of another embodiment, wherein the photosensitive region 490" has another u-shaped trench configuration. This configuration removes a portion of the metal layer 481 by any known etching process. It should be appreciated that while FIG. 4D shows a flat-bottomed trench, it may also have a rounded bottom or a v-shaped bottom. The various shapes, trenches and configurations may be obtained by selecting different methods of masking and/or etching as is known in the art. In particular, the various shapes, trenches and configurations can be formed using a host of dry or wet etch techniques including isotropic/anisotropic etching methods or deep dry etching techniques. The walls can also be sloped using wet isotropic etches.

It should be appreciated that necessary isolation implants can also be performed. It should also be appreciated that the trenches, pockets or indentations can be of varying depths if necessary for different colors to maximize the efficiency of light collection and the effective areas "d," as shown back in FIG. 4B, are kept the same as the known raised photosensitive region. In another embodiment, the trench can vary in depth to optimize red collection or, in one other embodiment, the blue and green photosensitive regions have a planar surface while the red photosensitive region has indentation features as described herein.

Generally, a photosensitive region according to the embodiments described herein has a greater signal-to-noise ratio than a prior art photosensitive region. However, there may still be some scatter due to a minimal amount of incident light that is never absorbed by the photosensitive region of the embodiments described herein. For instance, a photosensitive region having a u-shaped configuration has a greater surface area than a photosensitive region having a v-shaped configuration, however a u-shaped configuration may have a tendency to scatter a greater amount of light to neighboring pixels. Therefore, dimensions and spacing of both u- and v-shaped configurations may be selected to increase surface area for photon capture and minimize scatter. In the case of a v-shaped configuration, reflecting surfaces are preferably located so that any scattered light will go to neighboring pixels that are not being read at the same time, thereby minimizing optical cross-talk.

Although photosensitive region 490 of FIG. 3 is shown to have a single indentation or trench, it should be noted that the embodiments are not so limited. It should be appreciated that a photosensitive region having sidewalls with a pitch greater than ¼ the wavelength of light is suitable.

Figure 5A:
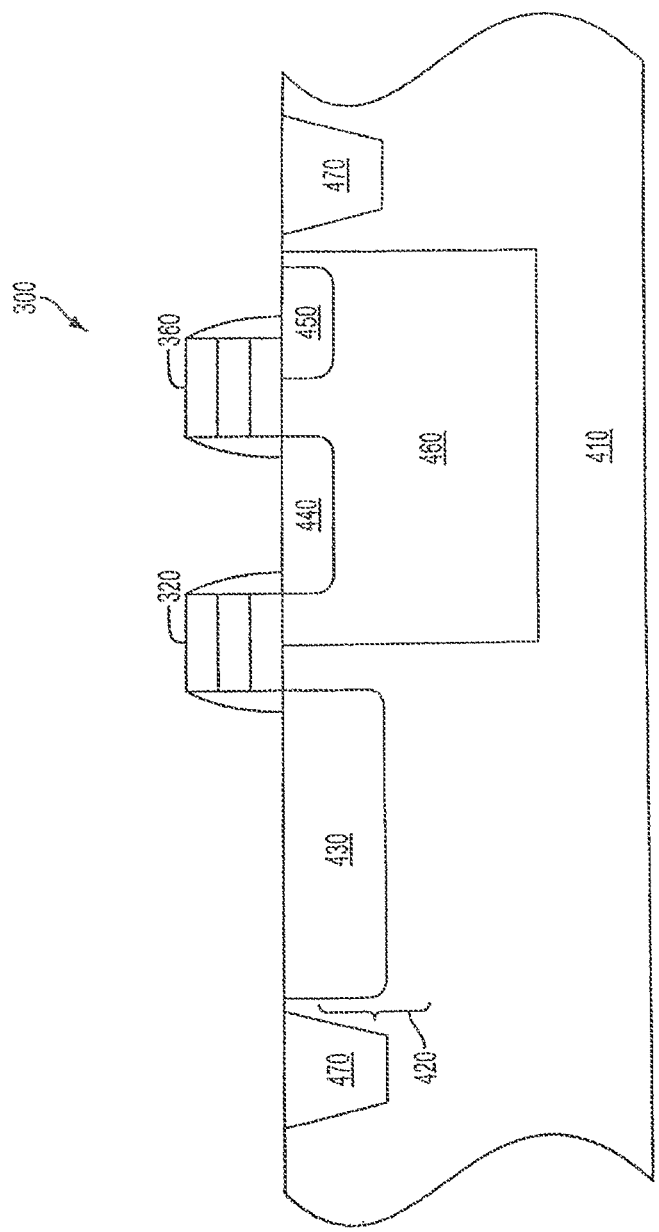
FIG. 5A is a cross-sectional view of another embodiment at an initial stage of processing.

FIG. 5A shows another embodiment of pixel cell 300 at an initial stage of fabrication. In a p-type substrate 410, a separate p-well 460 is formed therein. Multiple high energy implants may be used to tailor the profile and position of the p-type well 460; typically, the p-well region 460 will have a higher dopant concentration than the p-type substrate 410. A floating diffusion region 440 is formed in the p-well 460, and is doped n-type in this embodiment.

Isolation regions 470 are etched into the surface of the substrate 410, by any suitable method or technique, and are filled with an insulating material to form STI isolation regions. The isolation regions 470 may be formed either before or after formation of the p-well 460. A photosensor 420 is formed, in this embodiment, by creating a n-type region 430 in the p-type substrate 410. Photosensor 420 is not, however, limited to an n-p design and may be any suitable type of photosensor.

Also shown in FIG. 5A, a transfer transistor gate 320 and a reset transistor gate 360 are formed at the surface of the substrate 410 between the photosensor 420 and floating diffusion region 440. The transfer and reset transistor gates 320, 360 include an insulating or oxide layer 510 over a conductive layer 520 formed over a gate oxide layer 530 at the surface of the substrate 410. Preferably, the conductive layer 520 comprises a silicide or silicide/metal alloy. These layers 510, 520, 530 may, however, be formed of any suitable material using any suitable method. Completion of the transistor gates 320, 360 includes the addition of oxide spacers 515 on at least one side of the transistor gatestacks. The spacers 515 may be formed of any suitable material, including, but not limited to silicon dioxide. As desired, other transistor gates may be erected simultaneously with transfer transistor gate 320 and reset transistor gate 360 during this step, and may or may not contain the same layer combinations as these gate stacks.

Figure 5B:
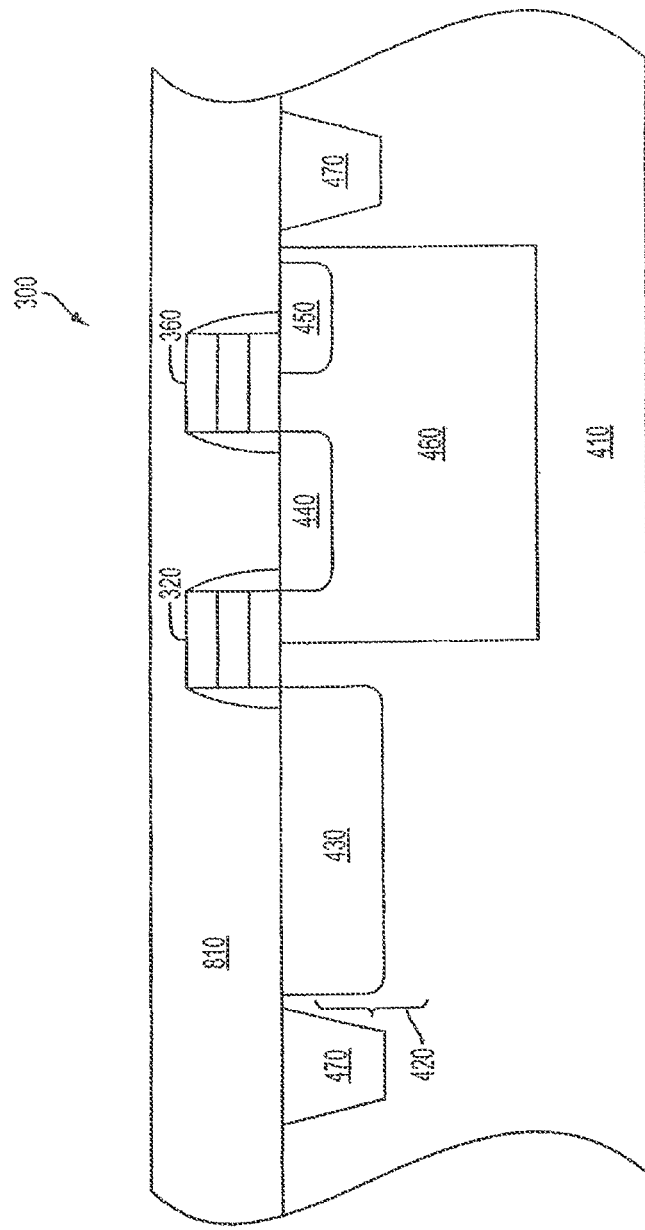
FIG. 5B illustrates the embodiment of FIG. 5A at a stage of processing subsequent to that shown in FIG. 5A.
Figure 5C:
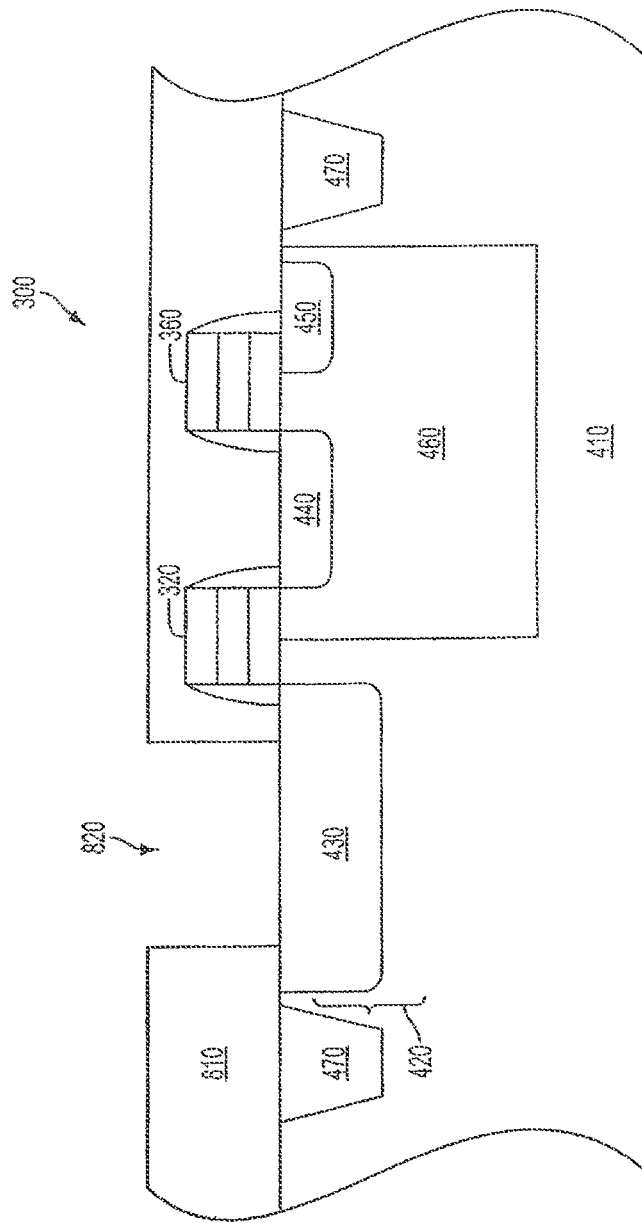
FIG. 5C illustrates the embodiment of FIG. 5A at a stage of processing subsequent to that shown in FIG. 5B.
Figure 5D:
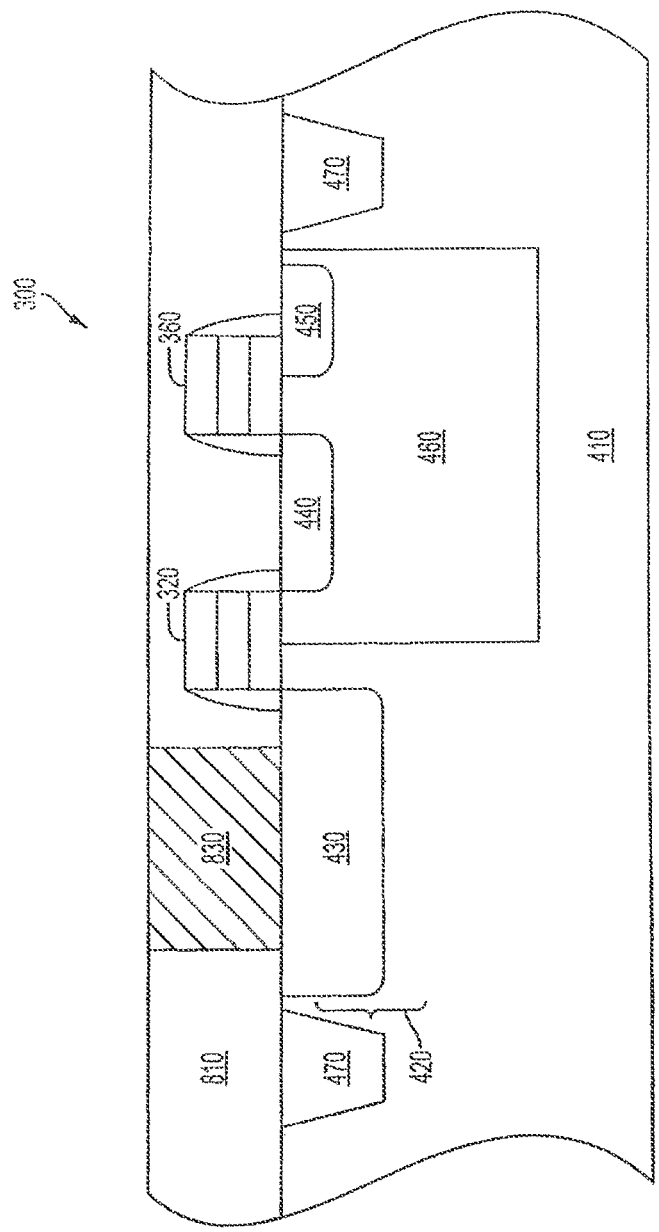
FIG. 5D illustrates the embodiment of FIG. 5A at a stage of processing subsequent to that shown in FIG. 5C.
Figure 5E:
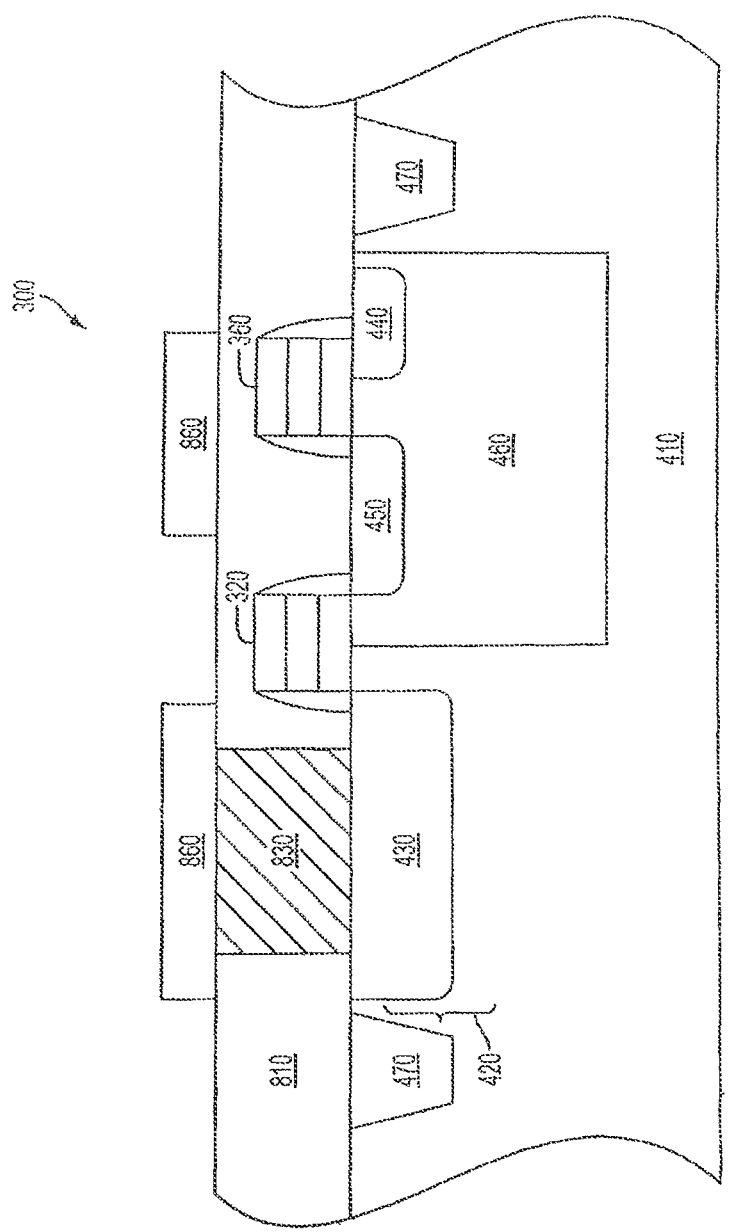
FIG. 5E illustrates the embodiment of FIG. 5A at a stage of processing subsequent to that shown in FIG. 5D.
Figure 5F:
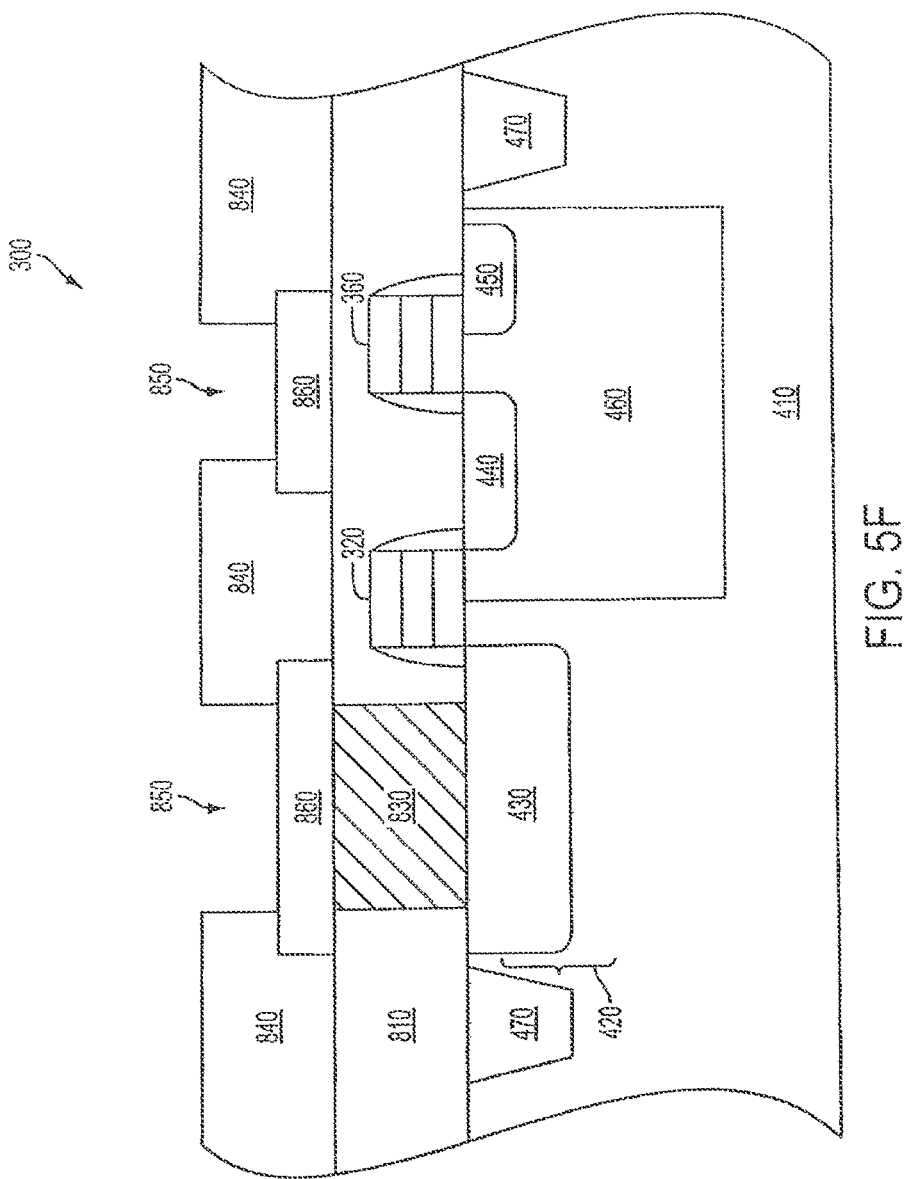
FIG. 5F illustrates the embodiment of FIG. 5A at a stage of processing subsequent to that shown in FIG. 5E.

Referring to FIG. 5B, a boron doped phosphosilicate glass (BPSG) layer 810 is deposited over substrate 410. Then, a contact 820 is formed to expose photosensor 420 as shown in FIG. 5C. Contact 820 can be formed using any etch method known in the art. A metal layer 830, e.g., Tungsten, is deposited to fill contact 820, as shown in FIG. 5D, and then, metal layer 830 is planarized using e.g., chemical mechanical polishing (CMP). Referring to FIG. 5E, a first metal interconnect 860 is formed above metal layer 830 and layer 810. A interlevel dielectric layer (ILD) 840, as shown in FIG. 5F, is patterned above first metal interconnect layer 860 and layer 810. ILD layer 840 comprises an oxide in this embodiment, however, it should be appreciated that ILD layer 840 should not be so limited.

Still referring to FIG. 5F, vias 850 are formed in the ILD layer 840. Each via 850 can be formed using any etch method known in the art. In FIG. 5G, second metal interconnect layer 870 is formed to fill the vias 850 and above ILD layer 840. The second metal interconnect layer 870, in this embodiment, is aluminum. It should be appreciated, however, that second metal interconnect layer 870 can be any type of metal layer known in the art.

Figure 5H:
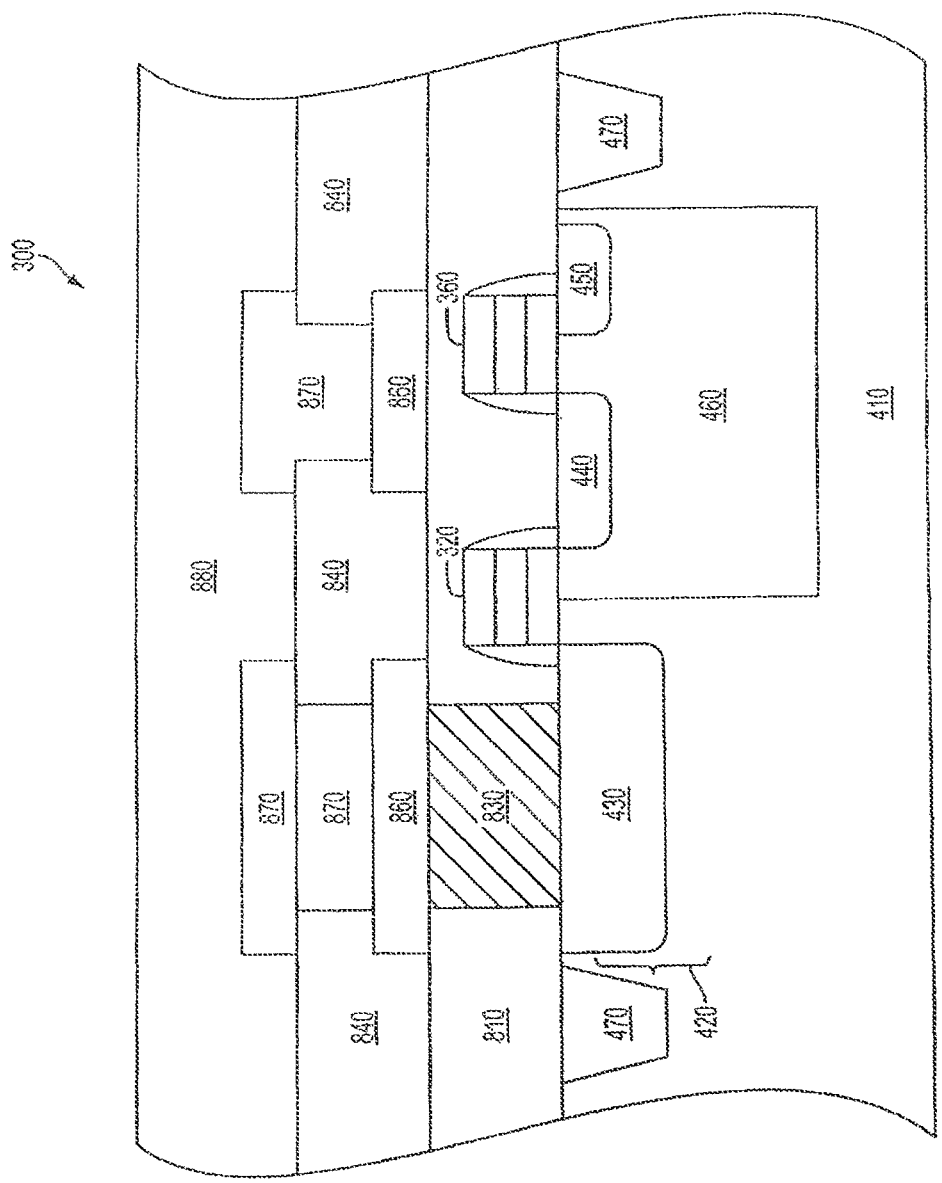
FIG. 5H illustrates the embodiment of FIG. 5A at a stage of processing subsequent to that shown in FIG. 5G.
Figure 51:
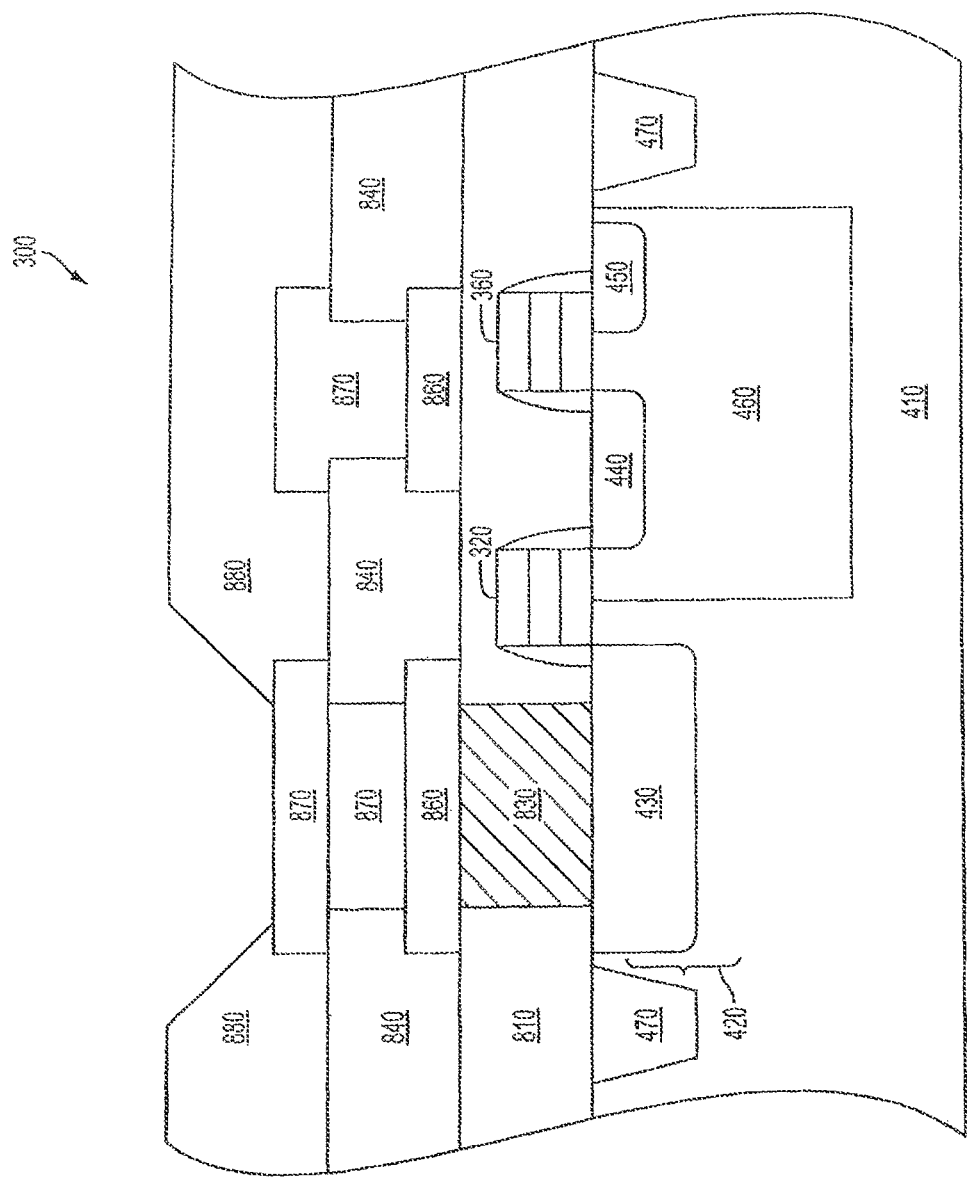
Figure 5J:
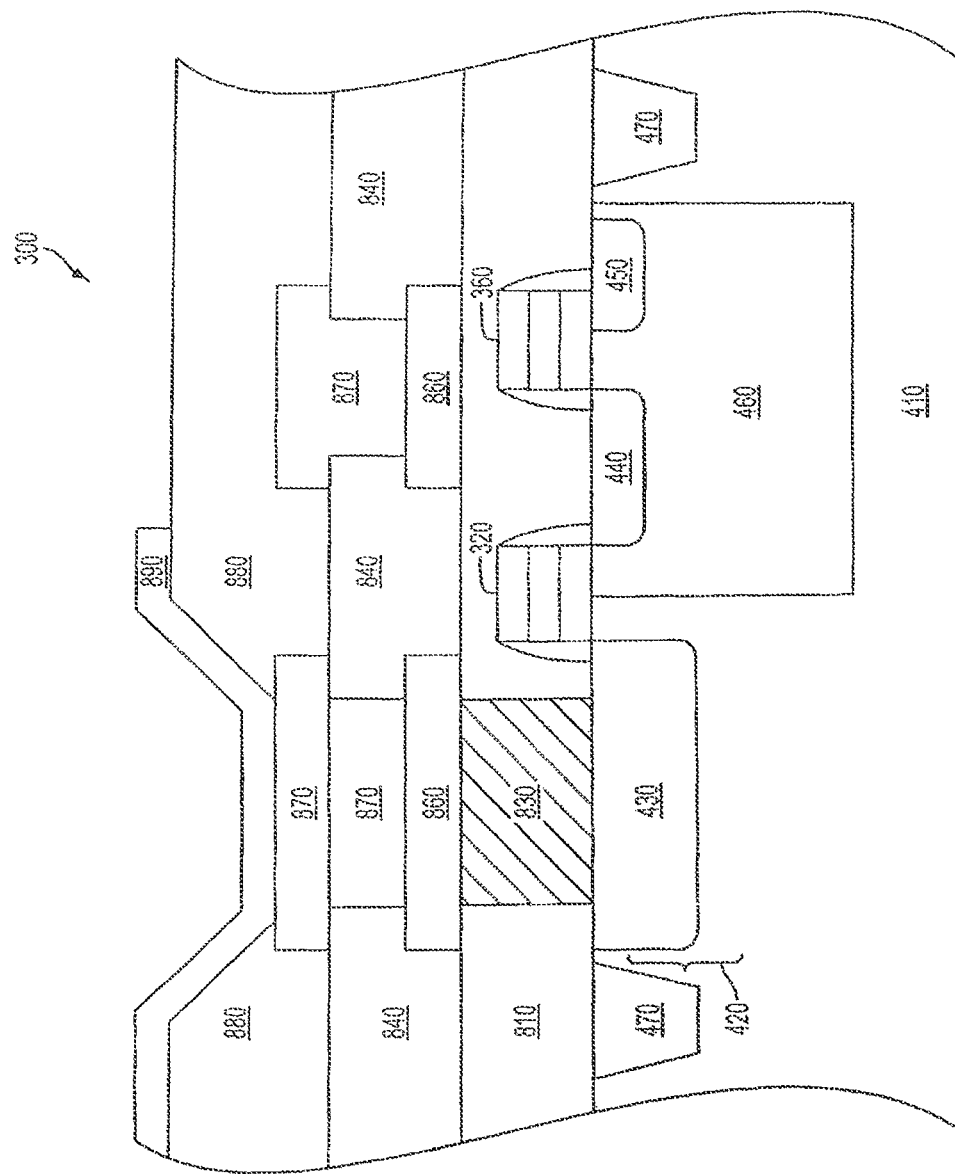
FIG. 5J illustrates the embodiment of FIG. 5A at a stage of processing subsequent to that shown in FIG. 5I.
Figure 5K:
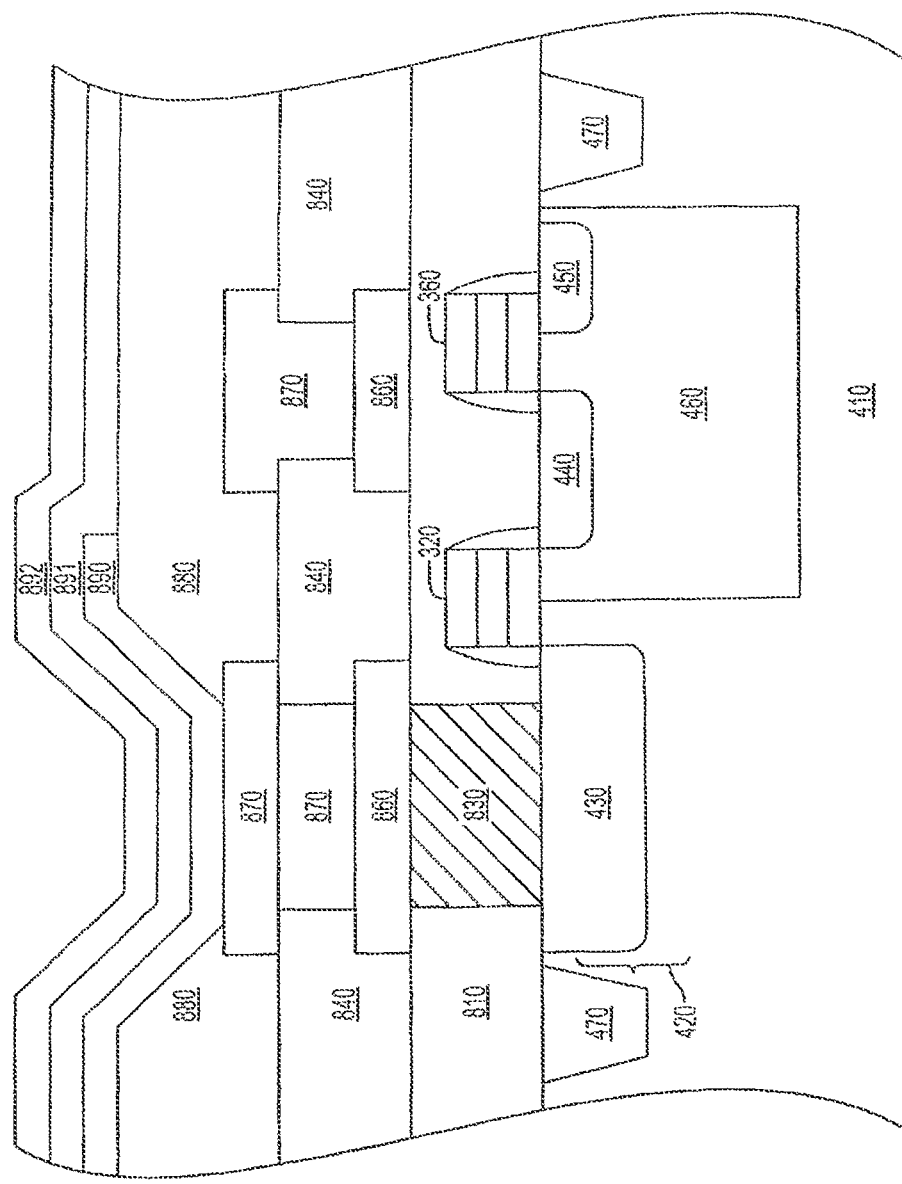
FIG. 5K illustrates the embodiment of FIG. 5A at a stage of processing subsequent to that shown in FIG. 5J.

Referring to FIG. 5H, a second ILD layer 880 is deposited above second metal interconnect layer 870 and ILD layer 840. The second ILD layer 880 in this embodiment comprises an oxide, however, similar to ILD layer 840, it should not be so limited. In FIG. 5I, ILD layer 880 is etched using any method known in the art to form the indentation shapes described above. Then in FIG. 5J, a third metal interconnect layer 890 (same as layer 481 in FIGS. 4A-4C) is formed above ILD layer 880. The third metal interconnect layer 890 is then patterned and etched. In FIG. 5K, a hydrogenated amorphous silicon layer 891 and a top electrode layer 892 are deposited above the third metal interconnect layer 890. The described process flow can also be used to fabricate the embodiments of FIGS. 4B-4D.

At this stage, the formation of the pixel cell 300 (FIG. 5K) is essentially complete. Additional processing steps may be used to form additional insulating, shielding, and metallization layers as desired (described in more detail below).

Figure 6A:
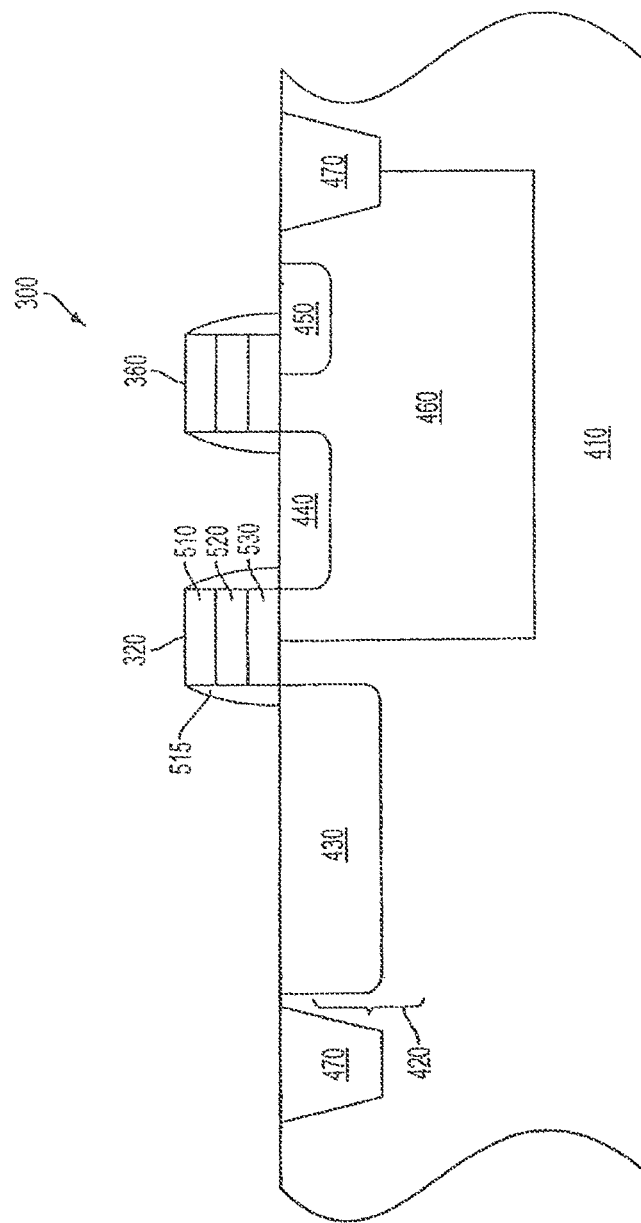
FIG. 6A is a cross-sectional view of an embodiment of the pixel cell of FIG. 4 during an initial stage of processing.

FIG. 6A shows another embodiment of a pixel cell 300 at an initial stage of fabrication. In a p-type substrate 410, a separate p-well 460 is formed therein. Multiple high energy implants may be used to tailor the profile and position of the p-type well 460; typically, the p-well region 460 will have a higher dopant concentration than the p-type substrate 410. A floating diffusion region 440 is formed in the p-well 460, and is doped n-type in this embodiment.

Isolation regions 470 are etched into the surface of the substrate 410, by any suitable method or technique, and are filled with an insulating material to form STI isolation regions. The isolation regions 470 may be formed either before or after formation of the p-well 460. A photosensor 420 is formed, in this embodiment, by creating a n-type region 430 in the p-type substrate 410. Photosensor 420 is not, however, limited to an n-p design and may be any suitable type of photosensor.

Also shown in FIG. 6A, a transfer transistor gate 320 and a reset transistor gate 360 are formed at the surface of the substrate 410 between the photosensor 420 and floating diffusion region 440. The transfer and reset transistor gates 320, 360 include an insulating or oxide layer 510 over a conductive layer 520 formed over a gate oxide layer 530 at the surface of the substrate 410. Preferably, the conductive layer 520 comprises a silicide or silicide/metal alloy. These layers 510, 520, 530 may, however, be formed of any suitable material using any suitable method. Completion of the transistor gates 320, 360 includes the addition of oxide spacers 515 on at least one side of the transistor gatestacks. The spacers 515 may be formed of any suitable material, including, but not limited to silicon dioxide. As desired, other transistor gates may be erected simultaneously with transfer transistor gate 320 and reset transistor gate 360 during this step, and may or may not contain the same layer combinations as these gate stacks.

Figure 6B:
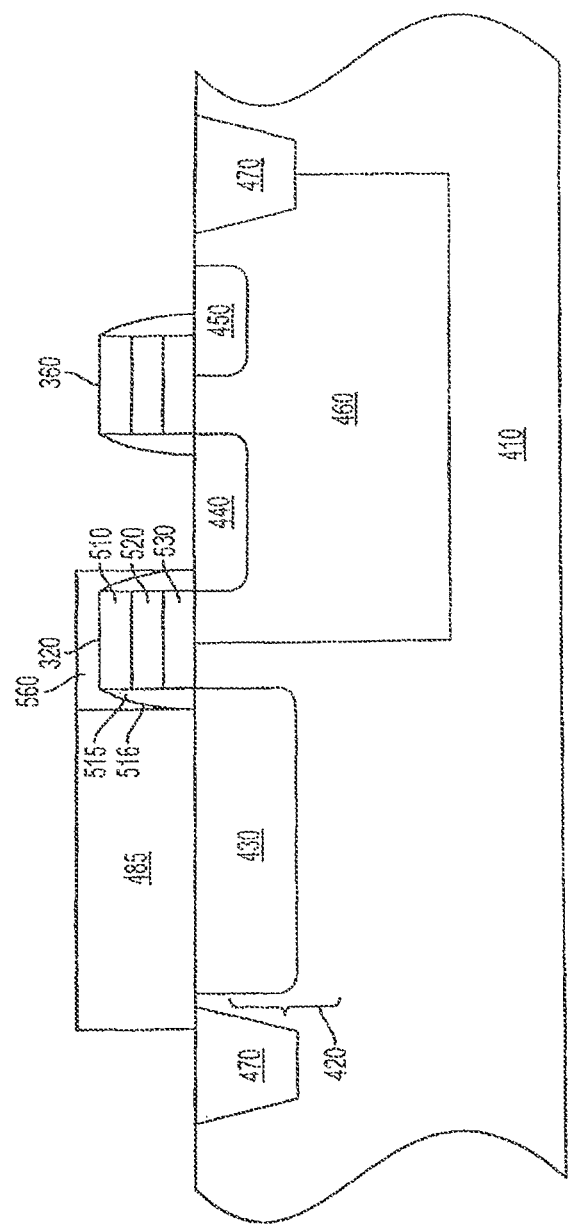
FIG. 6B illustrates the embodiment of FIG. 6A at a stage of processing subsequent to that shown in FIG. 6A.

Referring now to FIG. 6B, a selective epitaxial layer 485 is grown near the surface of the substrate 410, over the photosensor 420 and adjacent the sidewall 516 of spacer 515 of the transfer transistor gate 320. The epitaxial layer 485 is grown over this selected region using a hard mask, for example, a nitride film, to cover other regions of the substrate 410 such as the floating diffusion region 440. By performing a chemical vapor deposition process, the epitaxial layer 485 may be formed using any suitable precursor (e.g., silicon tetrachloride, silane, and dichlorosilane). In addition, the epitaxial layer 485 can be doped as either n-type or p-type by the addition of a suitable dopant gas into the deposition reactants. In the illustrated embodiment, the epitaxial layer 485 is doped p-type, to create a p-n junction at the intersection of the epitaxial layer 485 with the surface layer 430. The epitaxial layer 485 is planarized using CMP to a height of about 500-1000 Angstroms above the surface of the substrate. An oxide cap 560 may be used to cover gate stacks 320, 360 to act as a CMP stop.

Figure 6C:
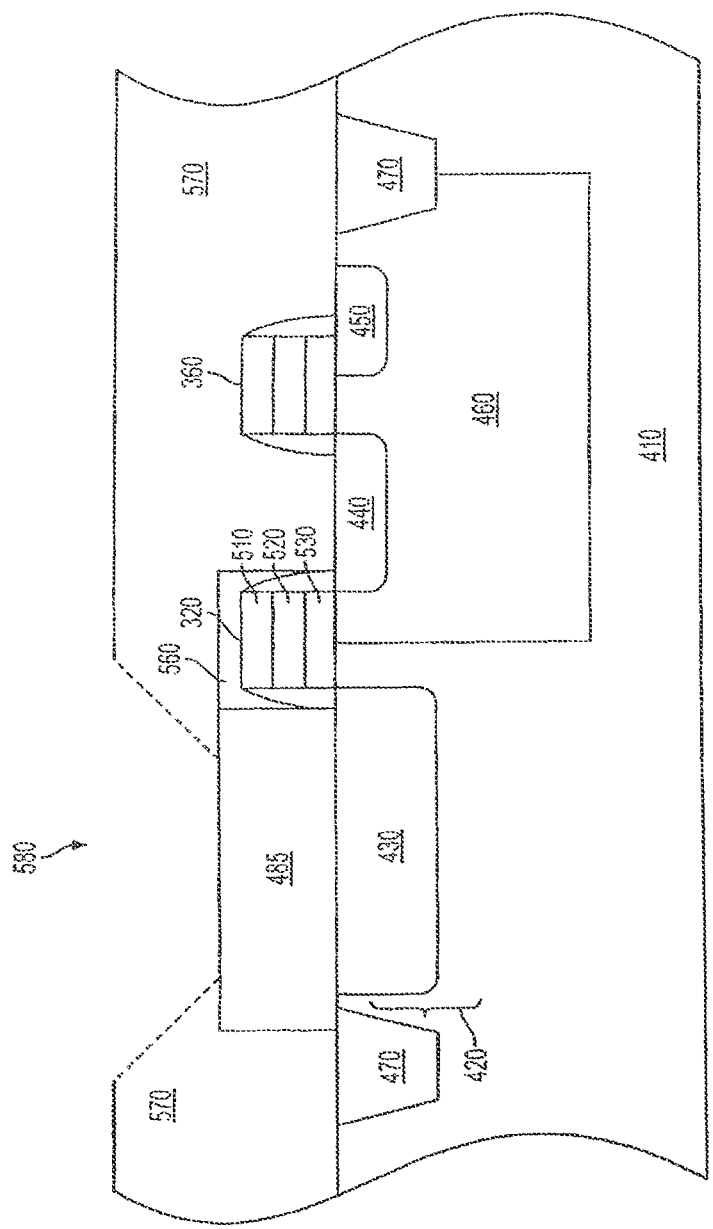
FIG. 6C illustrates the embodiment of FIG. 6A at a stage of processing subsequent to that shown in FIG. 6B.

Subsequently, as shown in FIG. 6C, a buffer layer 570 (e.g., TEOS or BPSG) is deposited over the entire substrate 410. An opening 580 is then patterned in the layer 570 above the photosensor 420 in the substrate 410.

Figure 6D:
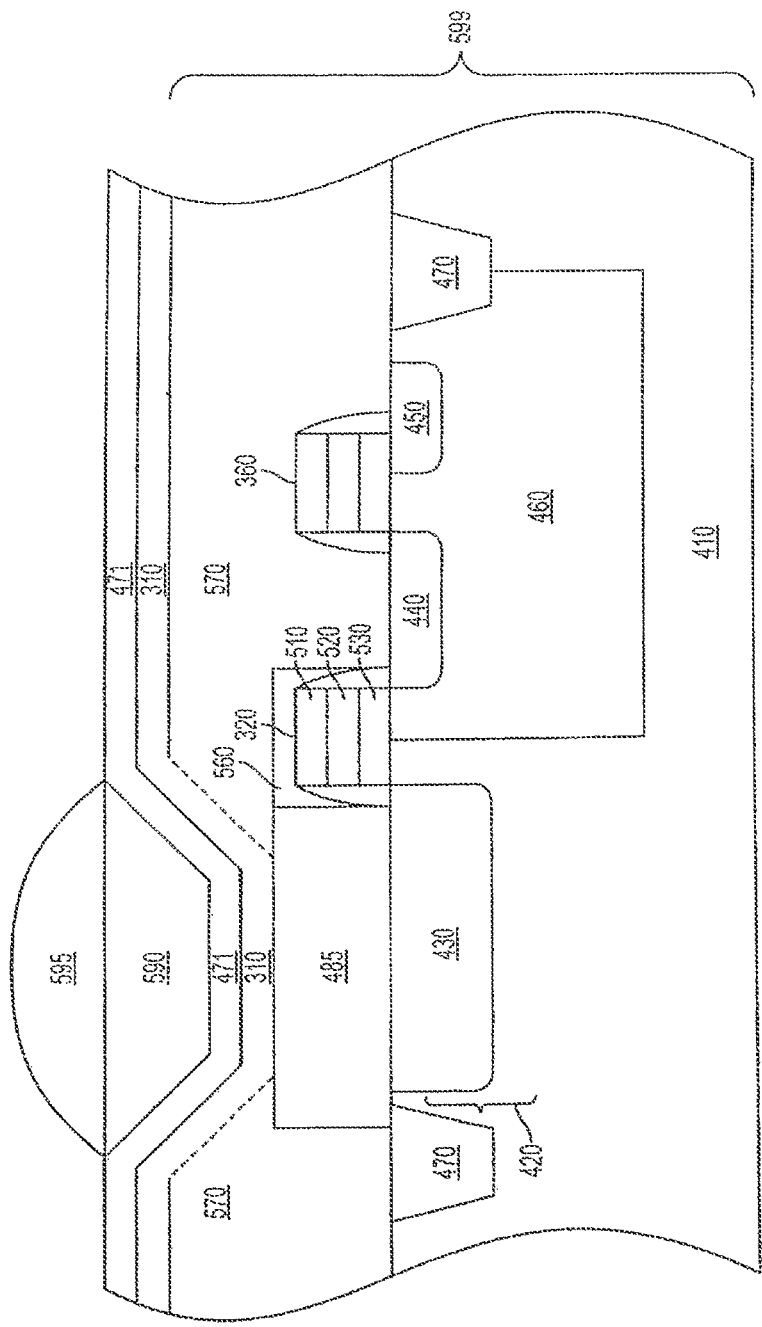
FIG. 6D illustrates the embodiment of FIG. 6A at a stage of processing subsequent to that shown in FIG. 6C.

Referring now to FIG. 6D, hydrogenated amorphous silicon is deposited to fill the opening 580 and to cover the buffer layer 570, creating a layer 310 being for the raised photosensitive region 490 (FIG. 4). The layer 310 is then planarized to a thickness of about 500-1000 Angstroms to reform the indentation. A top electrode layer 471 is deposited above layer 310. A color filter array 590 can then be formed above top electrode layer 471, followed by a microlens 595 being formed above color filter array 590. It should be appreciated that a second hydrogenated amorphous silicon layer (not shown) may also be deposited on top of layer 310. It should also be appreciated that a metal conductive layer 481, as illustrated in FIGS. 4A, 4C and 4D, can be blanket deposited to cover the buffer layer 570 before depositing hydrogenated amorphous silicon layer 310 and top electrode layer 471, if desired. The metal conductive layer 481 would then be planarized using CMP to reform an indentation (opening 580).

Figure 6E:
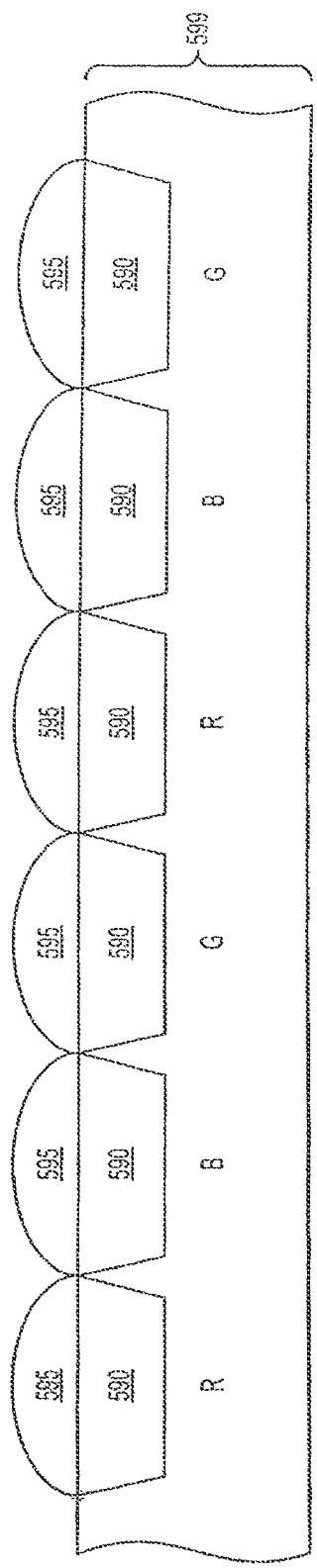
FIG. 6E illustrates another embodiment discussed herein.

Oppositely doping layers 310 and 471, respectively p-type and n-type, will create an additional p/n junction raised above the photosensor 420. Alternatively, the two amorphous silicon layers may be doped the same type (either n-type or p-type depending on the dopant used for the surface region 430 and epitaxial region 485) as to create effectively one layer. The concentration levels of dopants may be similar to that of a conventional photodiode. Using conventional masking techniques, the amorphous silicon layer can be patterned as desired. It should be appreciated that the resulting raised photodiode structure 599 can be implemented as a plurality of photodiode structures or an array, as shown in FIG. 6E, each respective structure being for red light (R), blue light (B), or green light (G).

At this stage, the formation of the pixel cell 300 (FIG. 4) is essentially complete. Additional processing steps may be used to form insulating, shielding, and metallization layers as desired. For example, an inter-level dielectric (ILD) such as insulating layer 370 (FIG. 3) may be formed to provide adequate insulation between metallized layers as well as to isolate the amorphous silicon layer 310 of a pixel cell 300 from adjacent pixel cells. Because an increased percentage of each pixel cell is covered by photo-sensing material in accordance with this embodiment, transparent metallization layers may be used, so that light is not blocked from the photosensor. Conventional layers of conductors and insulators (not shown) may also be used to interconnect the structures and to connect the pixel to peripheral circuitry.

The described and illustrated embodiment above utilizes a silicon type substrate 410. Alternatively, it may be implemented as a SOI (silicon on insulator) design, utilizing any suitable insulating layer sandwiched between the substrate and an additional silicon layer. The other wafer structures discussed previously, such as SOS and germanium substrates, may also be used.

Figure 7:
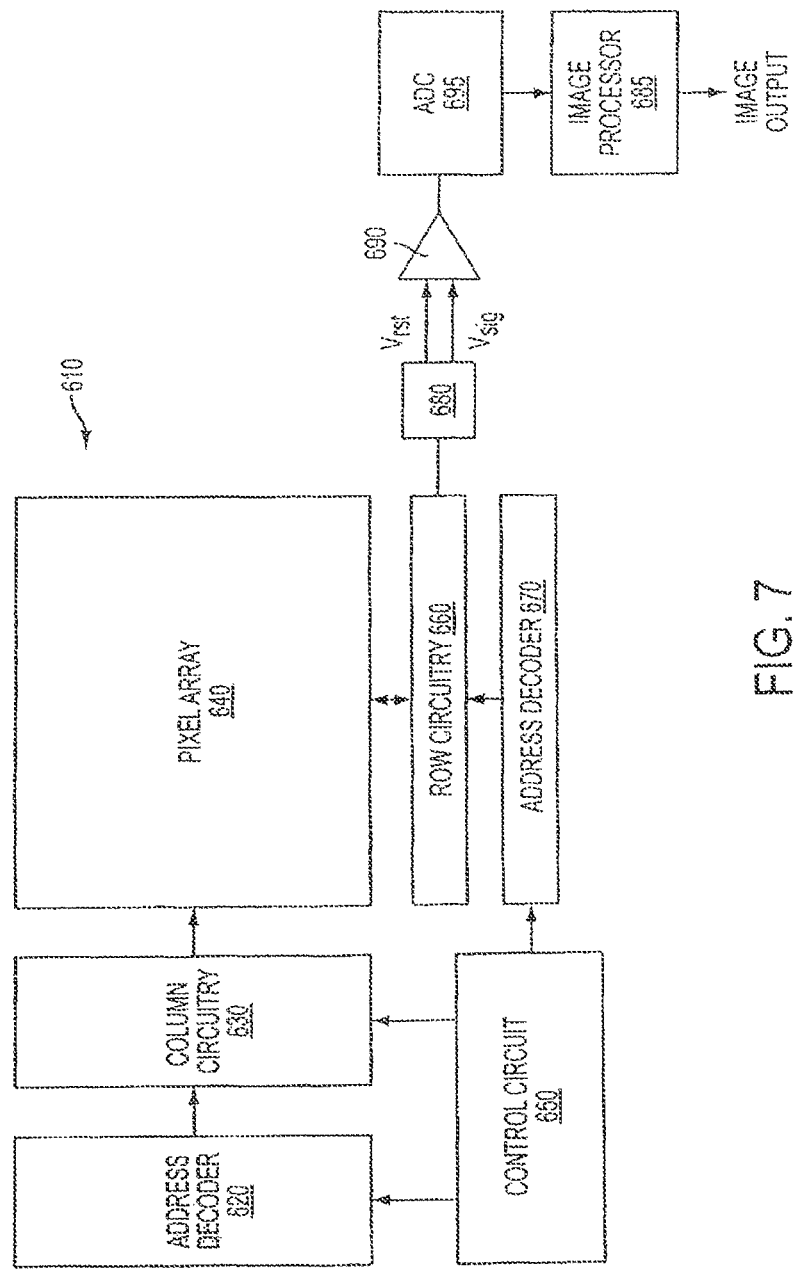
FIG. 7 is a block diagram of a CMOS imager chip having an array of pixel cells.

FIG. 7 illustrates a block diagram of an image sensor 610 having a pixel array 640 with each pixel cell being constructed as in one of the embodiments described above. Pixel array 640 comprises a plurality of pixels arranged in a predetermined number of columns and rows (not shown). Attached to the array 640 is signal processing circuitry, as described herein, at least part of which may be formed in the substrate. The pixels of each row in array 640 are all turned on at the same time by a row select line, and the pixels of each column are selectively output by respective column select lines.

A plurality of row and column lines are provided for the entire array 640. The row lines are selectively activated by a row driver 630 in response to row address decoder 620. The column select lines are selectively activated by a column driver 660 in response to column address decoder 670. Thus, a row and column address is provided for each pixel. The CMOS image sensor is operated by the timing and control circuit 650, which controls address decoders 620, 670 for selecting the appropriate row and column lines for pixel readout. The control circuit 650 also controls the row and column driver circuitry 630, 660 such that these apply driving voltages to the drive transistors of the selected row and column lines.

The pixel column signals, which typically include a pixel reset signal ($V_{rst}$) and a pixel image signal ($V_{sig}$), are read by a sample and hold circuit 680 associated with the column device 660. $V_{rst}$ is read from a pixel immediately after the floating diffusion region 440 is reset out by the reset transistor gate 360; $V_{sig}$ represents the charges transferred by the transfer transistor gate 320, from the photosensitive regions 420, 490 to the floating diffusion region. A differential signal ($V_{rst}$–$V_{sig}$) is produced by differential amplifier 690 for each pixel which is digitized by analog to digital converter 695 (ADC). The analog to digital converter 695 supplies the digitized pixel signals to an image processor 685 which forms a digital image.

Figure 8:
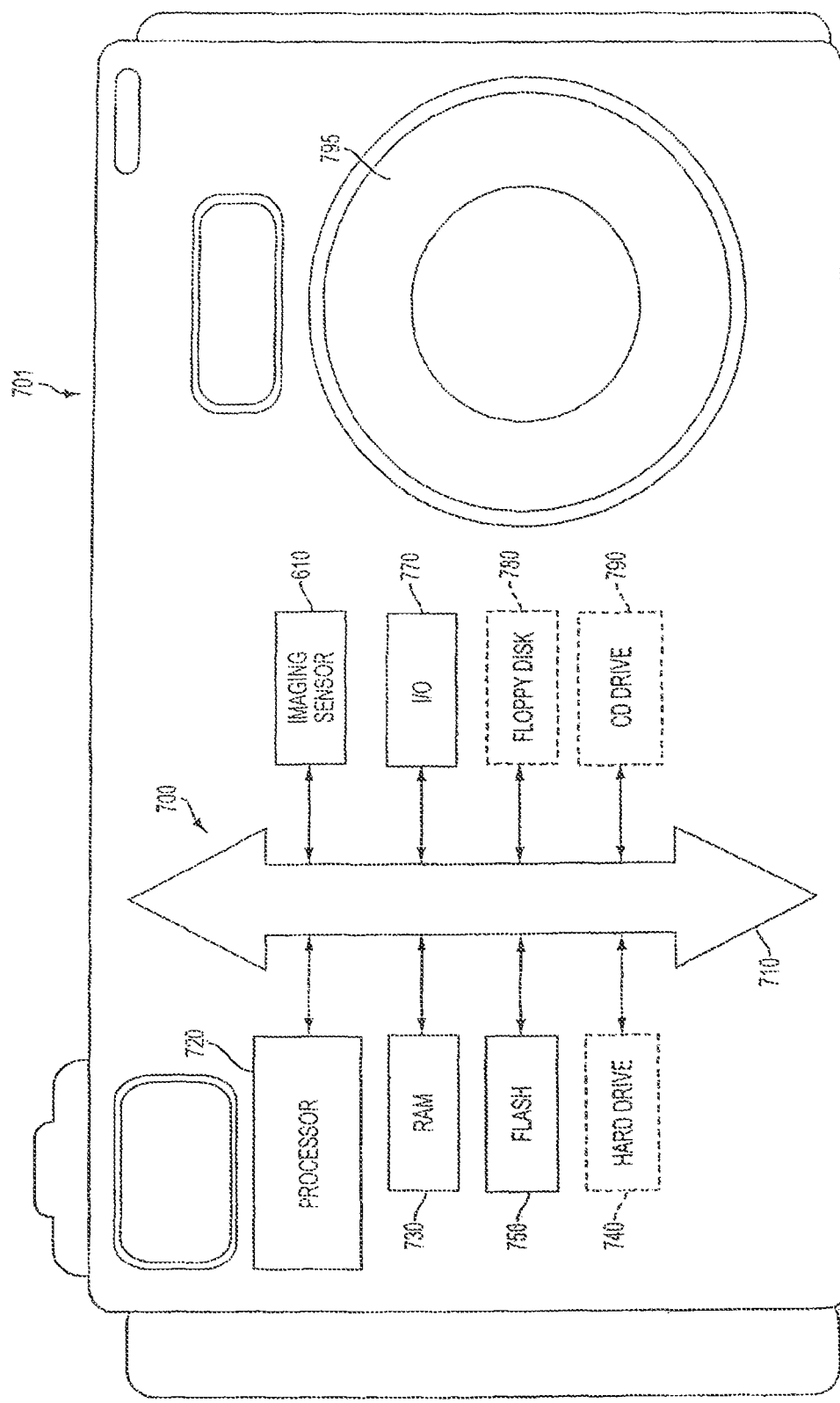
FIG. 8 is a schematic drawing of a processing system employing a CMOS imager having elevated photosensors constructed in accordance with an embodiment discussed herein.

FIG. 8 shows a system 700, which includes an image sensor 610 constructed in accordance with an embodiment described above. The system 700 may be part of a digital camera, which may be a digital, still or video camera 701, other camera or other imaging system. The image sensor 610 may receive control or other data from system 700. System 700 includes a processor 720 or a central processing unit (CPU) for image processing, or other image handling operations. The processor 720 communicates with various devices over a bus 710. Some of the devices connected to the bus 710 provide communication into and out of the system 700; an input/output (I/O) device 770 and image sensor 610 are such communication devices. Other devices connected to the bus 710 provide memory, for instance, a random access memory (RAM) 730 or a flash memory card 750. Lens 795 focuses an image on the pixel array of image sensor 610. It should be noted that the illustration of a camera is not intended to be limiting and that such an image sensor 610 could be included in any processor system including a scanner, machine vision, vehicle navigation, video phone, cell phone, personal digital assistant, surveillance system, auto focus system, star tracker system, motion detection system, and other systems employing an image sensor.

The system 700 could alternatively be part of a larger processing system, such as a computer. Through the bus 710, the processor system 700 illustratively communicates with other computer components, including but not limited to, a hard drive 740 and one or more peripheral memory devices such as a floppy disk drive 780, a compact disk (CD) drive 790.

The processes and devices described above illustrate methods and typical devices of many that could be used and produced. The above description and drawings illustrate embodiments, which achieve contain objects, features, and advantages described herein as well as others. However, it is not intended that the embodiments be strictly limited to those described and illustrated. Any modifications, though presently unforeseeable, of the embodiments that come within the scope of the following claims should be also considered.

I claim:

1. A pixel cell, comprising:
a photosensor formed from a substrate having a first conductivity type and a doped region having a second conductivity type;
a floating diffusion region;
a transfer transistor gate for transferring charge accumulated at the photosensor to the floating diffusion region;
a reset transistor gate; and
a raised photosensitive region formed completely above a top surface of the substrate,
wherein the raised photosensitive region includes an indentation feature in an upper surface of the raised photosensitive region,
wherein the raised photosensitive region comprises—
an epitaxial layer formed on the top surface of the substrate, the epitaxial layer having the first conductivity type;
a hydrogenated amorphous silicon layer formed above the epitaxial layer, the hydrogenated amorphous silicon layer having the second conductivity type; and
a metal conductive layer between the epitaxial layer and the hydrogenated amorphous silicon layer, and
wherein the epitaxial layer and the hydrogenated amorphous silicon layer form a p-n junction or a n-p junction above the top surface of the substrate.

2. The pixel cell of claim 1, wherein the raised photosensitive region further comprises—
an upper electrode layer formed above the hydrogenated amorphous silicon layer.

3. The pixel cell of claim 1, further comprising:
a color filter array formed in the indentation feature of the raised photosensitive region above the upper electrode layer; and
a microlens formed above the color filter array.

4. The pixel cell of claim 1, wherein the indentation feature includes curved sidewalls such that the indentation feature is u-shaped, and wherein the raised photosensitive region is configured to—
absorb a first portion of light radiation incident on the indentation feature;
reflect a second portion of the light radiation at a first location to a second location of the raised photosensitive region using the indentation feature; and
absorb at least some of the second portion of the light radiation at the second location of the raised photosensitive region.

5. The pixel cell of claim 1, wherein the indentation feature includes slanted sidewalls such that the indentation feature is v-shaped, and wherein the raised photosensitive region is configured to—
absorb a first portion of light radiation incident on the indentation feature;
reflect a second portion of the light radiation at a first location to a second location of the raised photosensitive region using the indentation feature; and
absorb at least some of the second portion of the light radiation at the second location of the raised photosensitive region.

6. The pixel cell of claim 1, wherein the raised photosensitive region is a first raised photosensitive region in a series of raised photosensitive regions of the pixel cell, and wherein each raised photosensitive region in the series has an effective area determined by a particular light wavelength.

7. The pixel cell of claim 1, wherein the first conductivity type is a p-conductivity type.

8. The pixel cell of claim 1, further comprising at least one trench isolation region formed in the raised photosensitive region and/or in the substrate, wherein the at least one isolation trench is filled with an insulating material such that the at least one isolation trench electrically isolates the raised photosensitive region and/or the pixel cell.

9. The pixel cell of claim 1, wherein the reset transistor gate and the transfer transistor gate have a similar gatestack and are formed on the top surface of the substrate.

10. An imaging system, comprising:
a pixel array having a plurality of pixel cells arranged in a predetermined number of columns and rows, wherein each pixel cell in the plurality of pixel cells includes—
a photosensor formed from a substrate having a first conductivity type and a doped region having a second conductivity type,
a floating diffusion region,
a transfer transistor gate for transferring charge accumulated at the photosensor to the floating diffusion region, and
a reset transistor gate;
a plurality of row and column lines electrically coupled to corresponding pixel cells in the plurality of pixel cells; and
timing and control circuitry configured to read out the charge accumulated in select pixel cells in the plurality of pixel cells via the plurality of row and column lines,
wherein at least one pixel cell in the plurality of pixel cells further includes a raised photosensitive region formed completely above a top surface of the substrate,
wherein the raised photosensitive region includes an indentation feature in an upper surface of the raised photosensitive region,
wherein the raised photosensitive region comprises—
an epitaxial layer formed on the top surface of the substrate, the epitaxial layer having the first conductivity type;
a hydrogenated amorphous silicon layer formed above the epitaxial layer, the hydrogenated amorphous silicon layer having the second conductivity type; and
a metal conductive layer between the epitaxial layer and the hydrogenated amorphous silicon layer, and
wherein the epitaxial layer and the hydrogenated amorphous silicon layer form a p-n junction or a n-p junction above the top surface of the substrate.

11. The imaging system of claim 10 further comprising:
a sample and hold circuit;
a differential amplifier configured to produce one or more differential signals;
an analog to digital converter configured to convert the one or more differential signals into one or more digital signals; and
an image processor configured to form a digital image from the one or more digital signals.

12. The imaging system of claim 10, wherein the raised photosensitive region of the at least one pixel cell further comprises—
an upper electrode layer formed above the hydrogenated amorphous silicon layer.

13. The imaging system of claim 12, wherein the raised photosensitive region of the at least one pixel cell further comprises— a color filter array formed in the indentation feature of the raised photosensitive region above the upper electrode layer; and a microlens formed above the color filter array.

14. The imaging system of claim 10, wherein the raised photosensitive region of the at least one pixel cell is configured to— absorb a first portion of light radiation incident on the indentation feature;

reflect a second portion of the light radiation at a first location to a second location of the raised photosensitive region using the indentation feature; and absorb at least some of the second portion of the light radiation at the second location of the raised photosensitive region.

15. The imaging system of claim 10, wherein the indentation features of the raised photosensitive region includes slanted or curved sidewalls such that the indentation feature is v-shaped or u-shaped, respectively.

16. The imaging system of claim 10, wherein the raised photosensitive region is a first raised photosensitive region in a series of raised photosensitive regions of the at least one pixel cell, and wherein each raised photosensitive region in the series has an effective area determined by a particular light wavelength.

17. The imaging system of claim 10, wherein the first conductivity type is a p-conductivity type.

18. The imaging system of claim 10, wherein the at least one pixel further comprises at least one trench isolation region formed in the raised photosensitive region and/or in the substrate, wherein the at least one isolation trench is filled with an insulating material such that the at least one isolation trench electrically isolates the raised photosensitive region and/or the at least one pixel cell from adjacent raised photosensitive regions and/or adjacent pixel cells in the pixel array.

19. A pixel cell, comprising:

a photosensor formed from a substrate having a first conductivity type and a doped region having a second conductivity type;

a floating diffusion region;

a transfer transistor gate for transferring charge accumulated at the photosensor to the floating diffusion region;

a reset transistor gate;

a raised photosensitive region formed completely above a top surface of the substrate, wherein the raised photosensitive region comprises— an indentation feature in an upper surface of the raised photosensitive region, an epitaxial layer formed on the top surface of the substrate, the epitaxial layer having the first conductivity type, and a hydrogenated amorphous silicon layer formed above the epitaxial layer, the hydrogenated amorphous silicon layer having the second conductivity type, wherein the epitaxial layer and the hydrogenated amorphous silicon layer form a p-n junction or a n-p junction above the top surface of the substrate;

a color filter array formed in the indentation feature of the raised photosensitive region; and a microlens formed above the color filter array.

* * * * *